United States Patent
Han et al.

(10) Patent No.: US 12,062,143 B2
(45) Date of Patent: Aug. 13, 2024

(54) MOBILE DEVICE AND MOBILE DEVICE CONTROL METHOD

(71) Applicant: SAMSUNG ELECTRONICS CO., LTD., Suwon-si (KR)

(72) Inventors: Ji Youn Han, Suwon-si (KR); Min Sun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 60 days.

(21) Appl. No.: 17/538,452

(22) Filed: Nov. 30, 2021

(65) Prior Publication Data

US 2022/0084299 A1  Mar. 17, 2022

Related U.S. Application Data

(63) Continuation of application No. PCT/KR2020/005415, filed on Apr. 24, 2020.

(30) Foreign Application Priority Data

May 31, 2019 (KR) .................. 10-2019-0064224

(51) Int. Cl.
*G06T 19/00* (2011.01)
*G06F 3/0482* (2013.01)
(Continued)

(52) U.S. Cl.
CPC .......... *G06T 19/006* (2013.01); *G06F 3/0482* (2013.01); *G06F 3/04845* (2013.01);
(Continued)

(58) Field of Classification Search
CPC ... G06T 19/006; G06T 19/20; G06T 2200/24; G06T 2219/2016; G06F 3/0482;
(Continued)

(56) References Cited

U.S. PATENT DOCUMENTS 10,176,641 B2   1/2019 Lindsay et al.
11,386,600 B2   7/2022 Joo
(Continued)

FOREIGN PATENT DOCUMENTS

CN    107852488 A    3/2018
CN    108780358 A    11/2018
(Continued)

OTHER PUBLICATIONS

International Search Report for PCT/KR2020/005415 dated May 31, 2019, with translation (5 pages including translation).
(Continued)

*Primary Examiner* — Chong Wu
(74) *Attorney, Agent, or Firm* — STAAS & HALSEY LLP

(57) ABSTRACT

A mobile device includes a display, a camera to capture an image of a space in which an image device can be installed, a user interface, and a controller. The controller can identify a plane from the image captured by the camera, control the display so as to display a grid on a virtual plane corresponding to the plane, adjust the grid based on an input of a user received via the user interface, and control the display so as to display, on the grid, the virtual image of the image device.

22 Claims, 29 Drawing Sheets

(51) Int. Cl.
*G06F 3/04845* (2022.01)
*G06T 19/20* (2011.01)
*G06V 20/20* (2022.01)
*H04N 23/60* (2023.01)

(52) U.S. Cl.
CPC .............. *G06T 19/20* (2013.01); *G06V 20/20* (2022.01); *H04N 23/64* (2023.01); *G06T 2200/24* (2013.01); *G06T 2219/2016* (2013.01)

(58) Field of Classification Search
CPC .. G06F 3/04845; G06F 1/1686; G06F 1/1694; G06F 3/0304; G06F 3/04815; G06F 30/13; G06F 3/011; G06F 3/005; G06V 20/20; H04N 23/64
See application file for complete search history.

(56) References Cited

U.S. PATENT DOCUMENTS

| | | | |
|---|---|---|---|
| 11,487,413 B2* | 11/2022 | Park | G06F 3/04842 |
| 2015/0331970 A1* | 11/2015 | Jovanovic | G06F 3/0488 703/1 |
| 2016/0189426 A1 | 6/2016 | Thomas et al. | |
| 2017/0010692 A1 | 1/2017 | Getz et al. | |
| 2017/0109929 A1 | 4/2017 | Meier et al. | |
| 2017/0256096 A1 | 9/2017 | Faaborg et al. | |

FOREIGN PATENT DOCUMENTS

| | | |
|---|---|---|
| JP | 2018-32131 | 3/2018 |
| KR | 10-2014-0133764 | 11/2014 |
| KR | 10-1636027 | 6/2016 |
| KR | 10-1651620 | 8/2016 |
| KR | 10-1770648 | 8/2017 |
| KR | 10-2018-0058048 | 5/2018 |
| WO | 2016/020778 A1 | 2/2016 |

OTHER PUBLICATIONS

Extended European Search Report dated May 25, 2022 in European Patent Application No. 20812726.6 (12 pages).
Office Action dated Feb. 2, 2024 issued in European Application No. 20 812 726.6.
Office Action dated Feb. 20, 2024 issued in Chinese Application No. 20208004106.1.
Korean Office Action dated May 21, 2024, for Korean Application No. 10-2019-0064224.

* cited by examiner

FIG.15
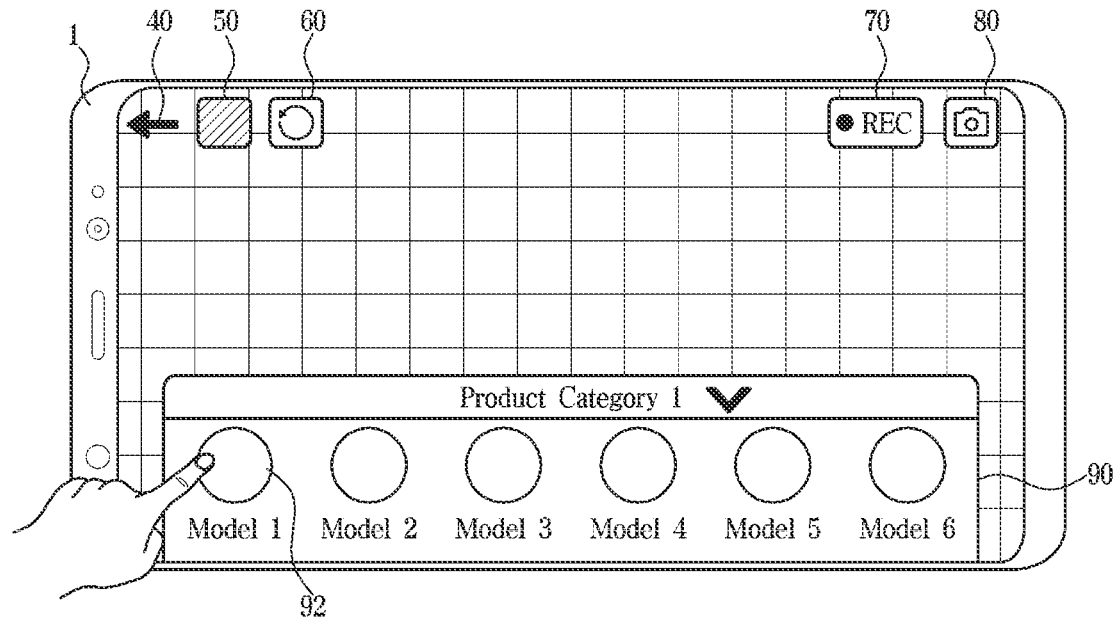
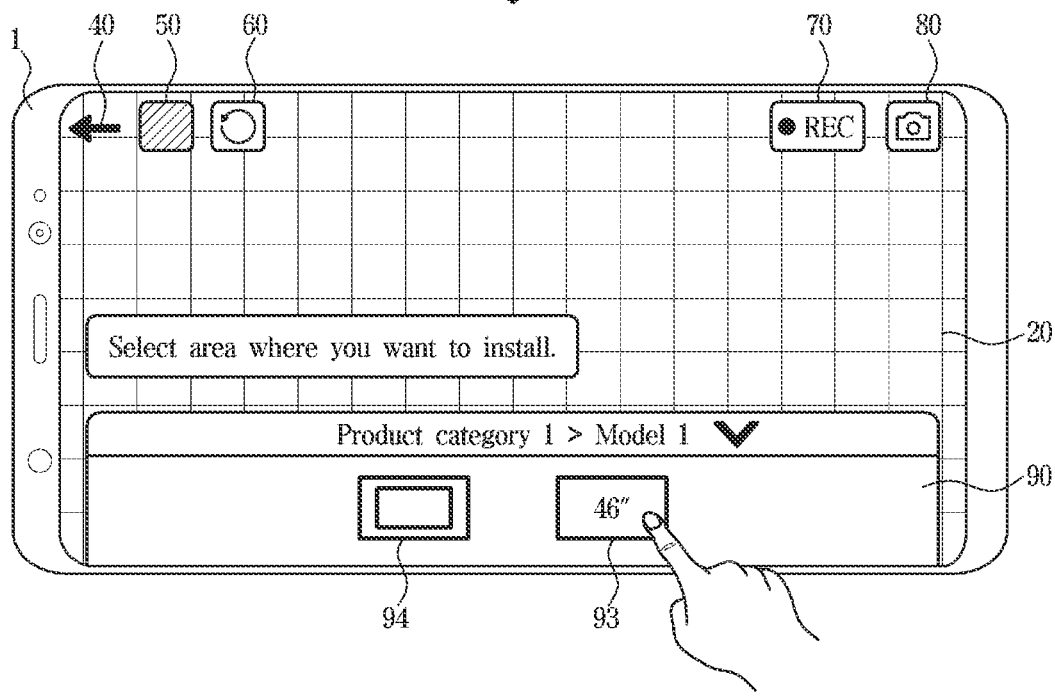

FIG.16
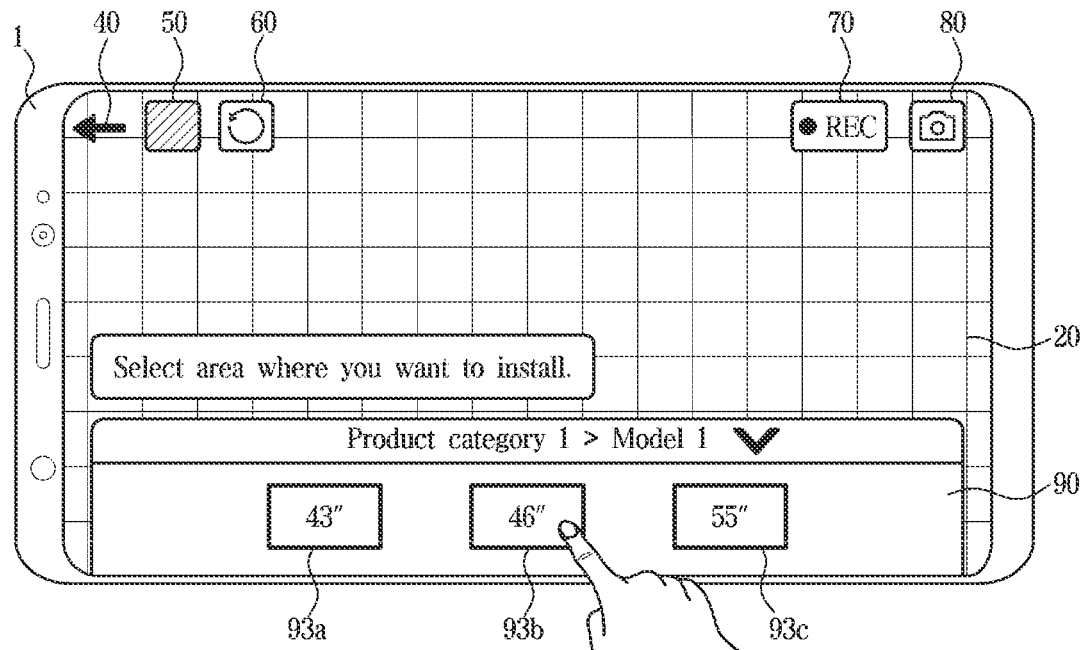
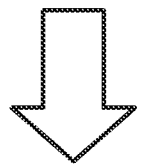
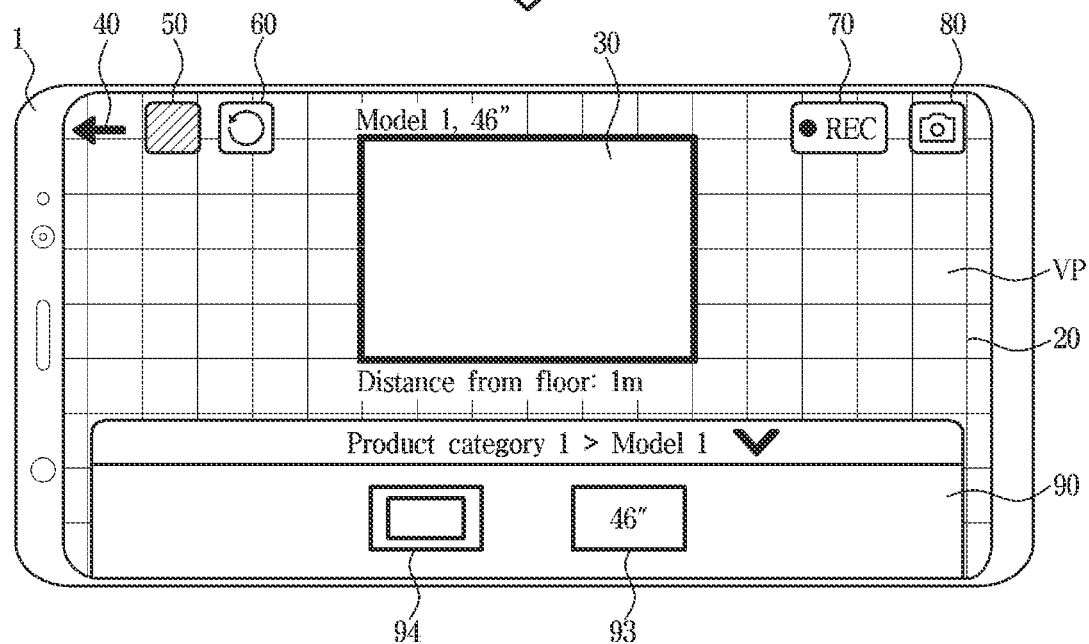

FIG.17
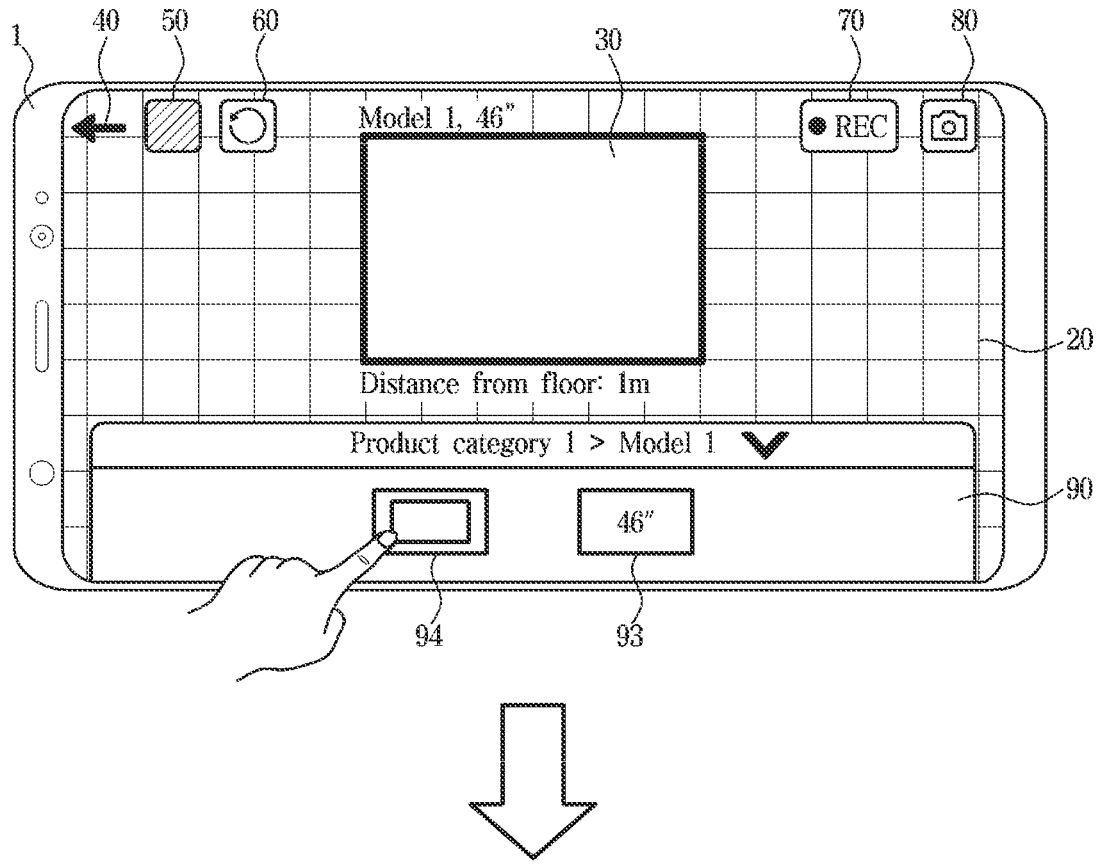
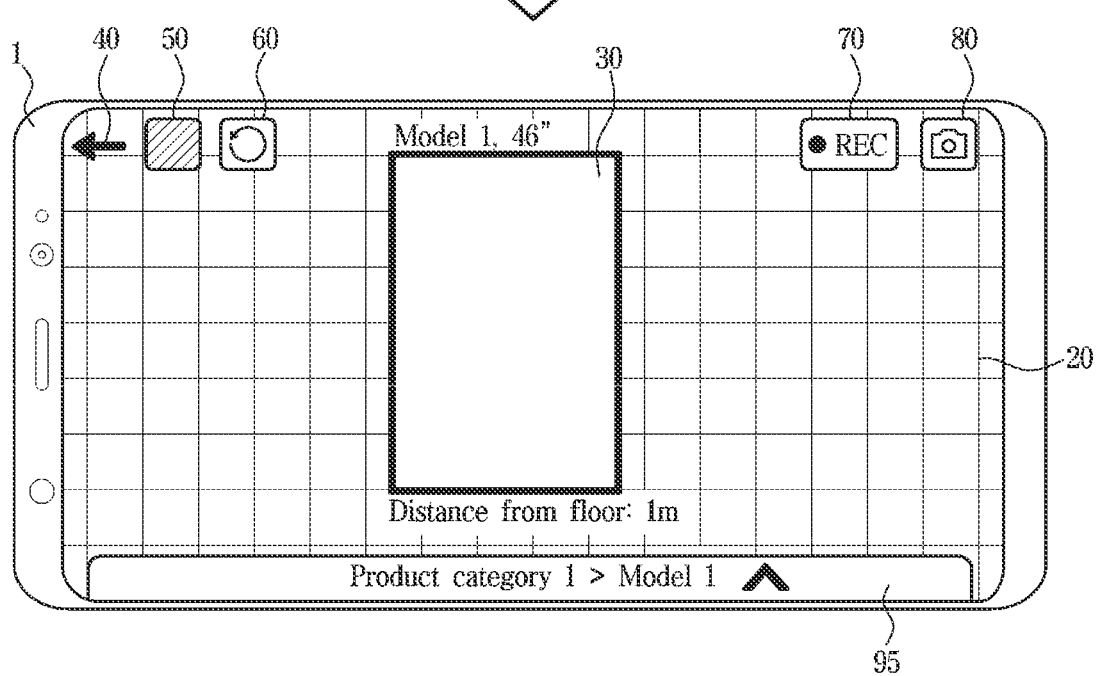

FIG.21
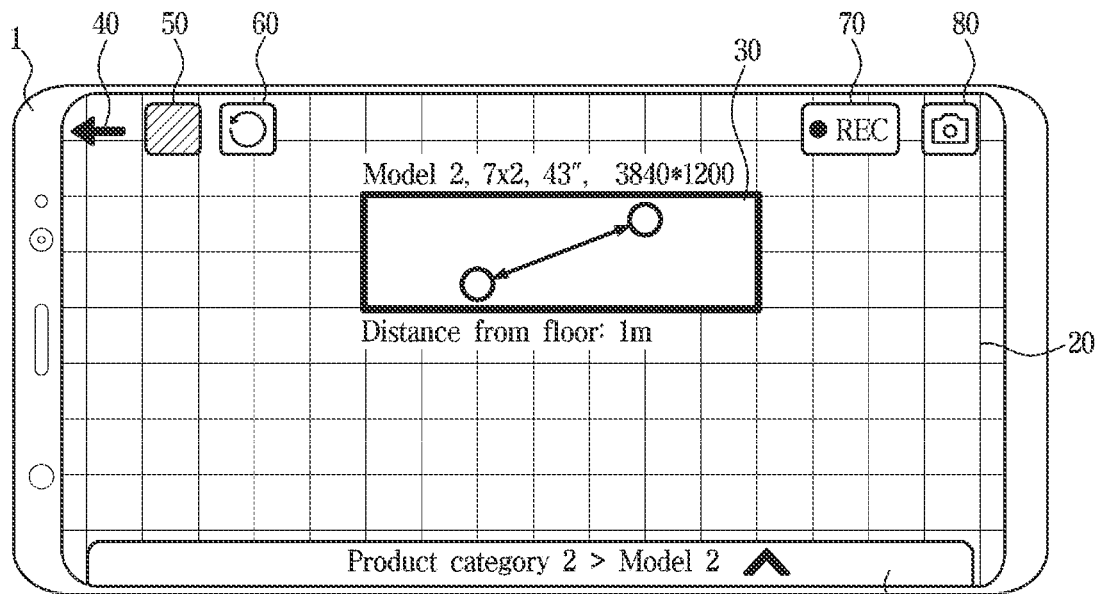
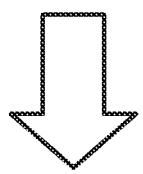
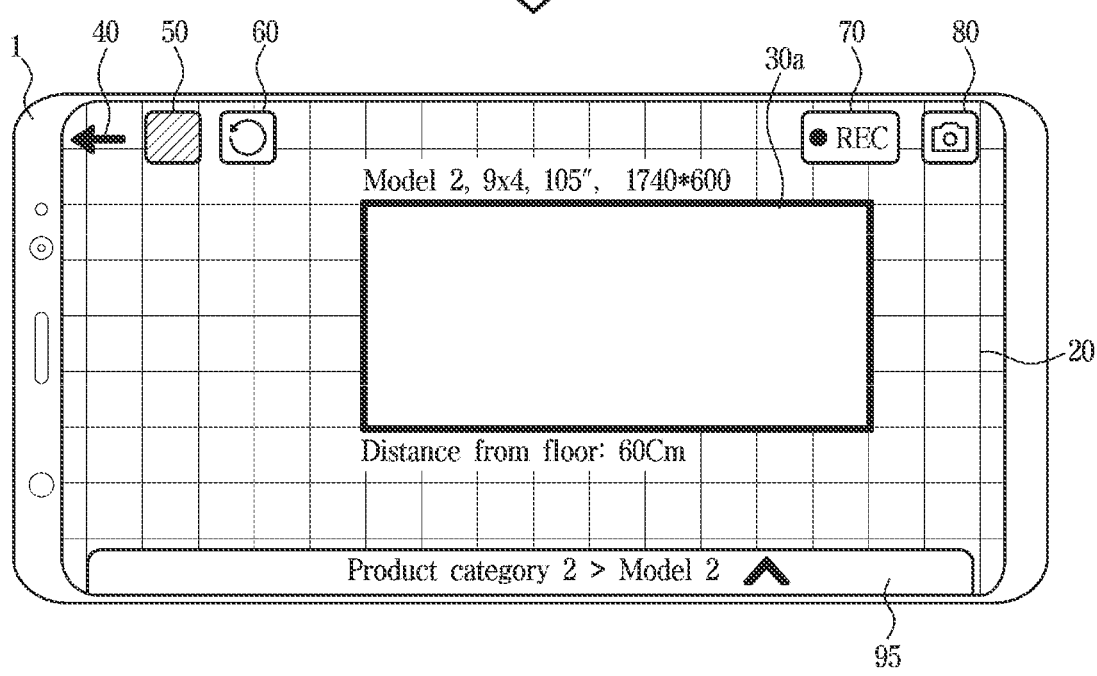

FIG.24
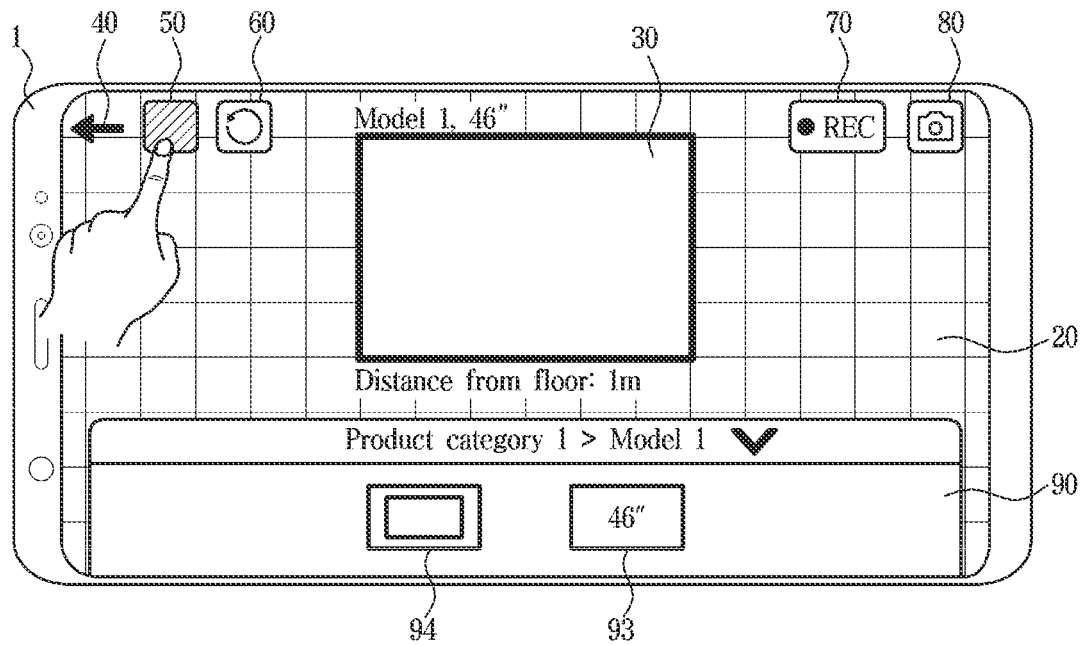
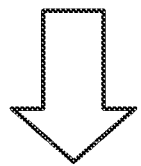
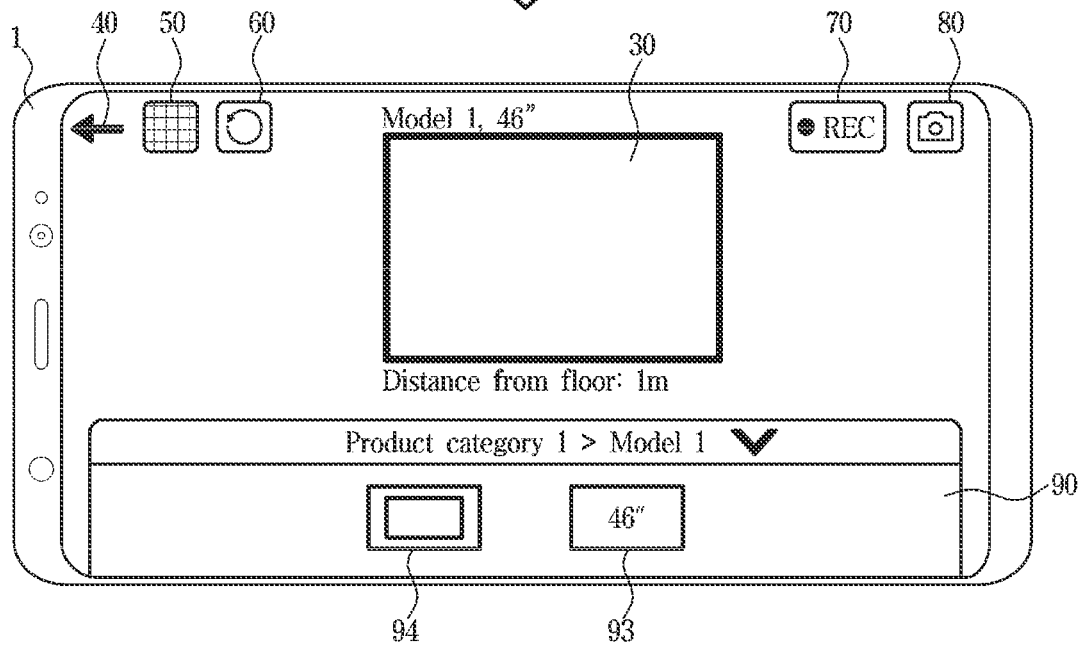

FIG.29
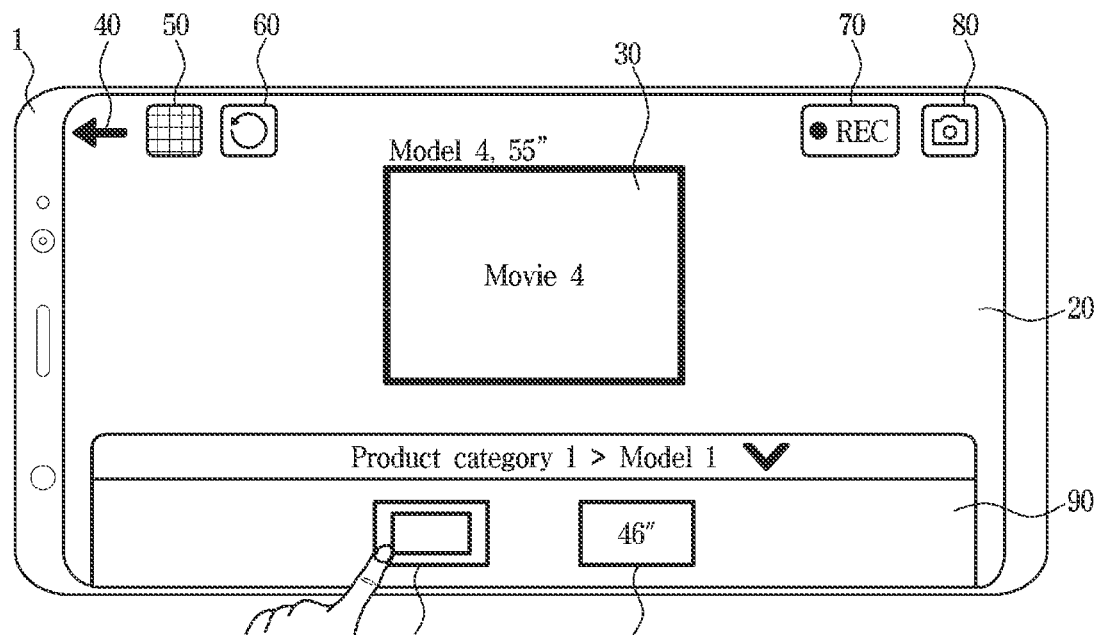
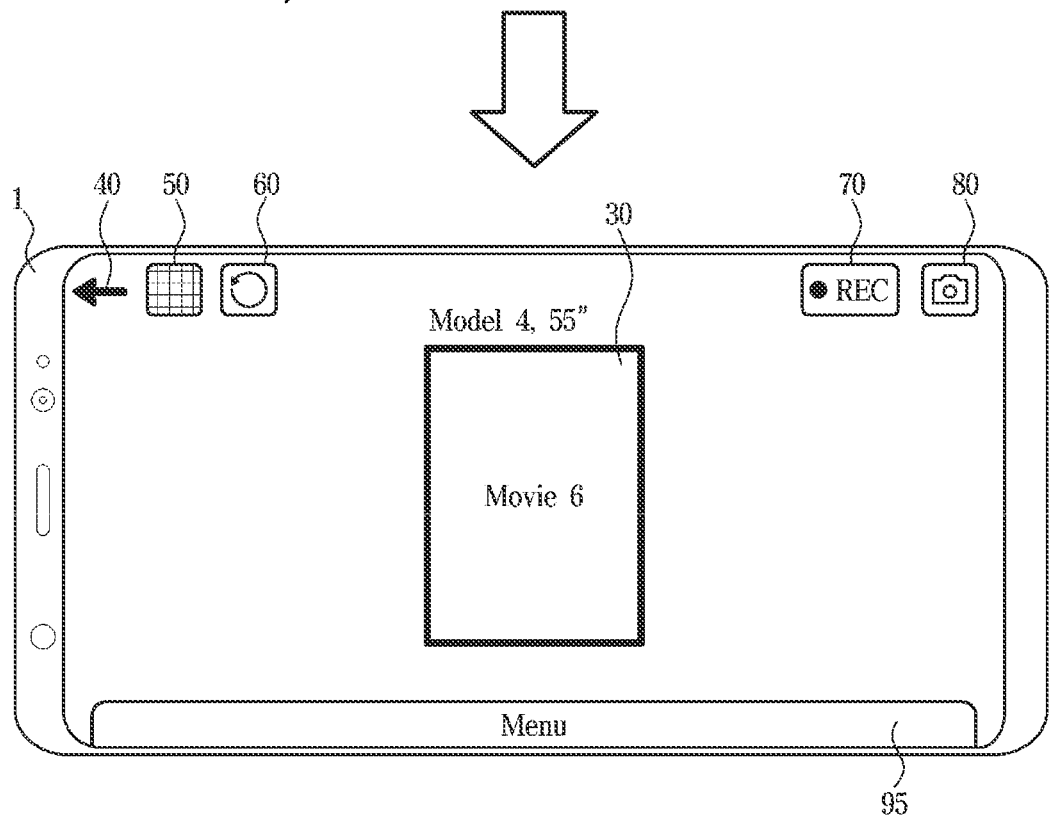

MOBILE DEVICE AND MOBILE DEVICE CONTROL METHOD

CROSS-REFERENCE TO RELATED APPLICATIONS

This application is a continuation application under 35 U.S.C. § 111(a) of International Application No. PCT/KR2020/005415, filed on Apr. 24, 2020, which claims priority to Korean Patent Application No. 10-2019-0064224 filed on May 31, 2019. The disclosures of each of International Application No. PCT/KR2020/005415 and Korean Patent Application No. 10-2019-0064224 are incorporated by reference herein in their entirety.

BACKGROUND

1. Field

The disclosure relates to a mobile device capable of simulating the installation of an image device using augmented reality technology. The disclosure also relates to a method of controlling the mobile device.

2. Description of the Related Art

Mobile devices are devices that provide various functions on the basis of mobility and are widely used in various fields. Mobile devices include various functional modules to provide various functions. For example, mobile devices include a camera module that provides an image collection function.

As a technology using the camera module of the mobile device, there is an augmented reality technology. Augmented reality technology refers to a graphic technology in which a virtual object or virtual information is superimposed on a real environment so that the object appears to exist in the real environment.

Augmented reality technology superimposes a virtual object on a real space, unlike the existing virtual reality technology that is implemented as a virtual space and a virtual object. Thus, additional information that is difficult to obtain in the real world alone may be supplemented and provided. Augmented reality technology may be applied to various real environments, and particularly, is spotlighted as a next-generation display technology suitable for ubiquitous environments.

SUMMARY

Additional aspects will be set forth in part in the description which follows and, in part, will be apparent from the description, or may be learned by practice of the example embodiments.

A mobile device according to one or more examples of the disclosure includes a display, a camera configured to capture an image of a space in which an image device is to be installed, a user interface, and a controller configured to identify a plane from the image captured by the camera, control the display to display a grid on a virtual plane corresponding to the plane, adjust the grid based on an input of a user received via the user interface, and control the display to display a virtual image of the image device on the grid.

The controller may adjust the grid based on the input of the user received via the user interface, by moving the grid.

The controller may adjust the grid based on the input of the user received via the user interface, by rotating a direction of the grid.

The controller may control the display to display the image of the space captured by the camera together with a guide line and identify the plane based on the guide line.

The controller may control the display to display the guide line as a base guide line or a corner guide line.

The controller may control the display to display the virtual image of the image device in a specified area of the grid based on an input of the user received via the user interface to select the specified area of the grid.

The controller may control the display to rotate the virtual image of the image device on the virtual plane based on an input of the user received via the user interface to rotate the virtual image of the image device.

The controller may control the display to further display text including at least one of a model name, a size, a resolution, and a distance from a floor of the image device corresponding to the virtual image of the image device.

The controller may display a menu bar, which enables a selection of at least one of a category, a model, and a size of the image device, and control the display to display the virtual image of the image device based on an input of the user received via the user interface to select the image device from the menu bar.

When a plurality of virtual images of a plurality of image device are displayed, the controller may entirely or partially delete the plurality of virtual images of the plurality of image devices based on an input of the user received via the user interface to delete one or more of the plurality of virtual images of the plurality of image devices.

The controller may control the display to display content on an area on which the virtual image of the image device is displayed based on an input of the user received via the user interface to select the content.

The controller may store a simulation result related to an installation of the image device as at least one of a video and a screenshot image.

A method of controlling a mobile device according to examples of the disclosure includes capturing an image of a space, in which an image device is allowed to be installed, by a camera, identifying a plane from the image captured by the camera, displaying a grid on a virtual plane corresponding to the plane, by a display, adjusting the grid based on an input of a user received via a user interface, and displaying a virtual image of the image device on the grid.

In the method, adjusting the grid may include moving the grid based on the input of the user received via the user interface.

In the method, adjusting the grid may include rotating a direction of the grid based on the input of the user received via the user interface.

The method may further include displaying, by the display, the image of the space captured by the camera together with a guide line, wherein the identifying the plane may include identifying the plane based on the guide line.

The displaying of the image of the space captured by the camera together with the guide line may include displaying the guide line as a base guide line or a corner guide line.

The displaying of the virtual image of the image device may include displaying the virtual image of the image device in a specified area of the grid based on an input of the user received via the user interface to select the specified area of the grid.

The method may further include receiving an input of the user via the user interface to rotate the virtual image of the image device, rotating the virtual image of the image device on the virtual plane based on the input of the user received via the user interface to rotate the virtual image of the image device, and displaying the rotated virtual image of the image device on the grid.

The method may further include displaying text including at least one of a model name, a size, a resolution, and a distance from a floor of the image device corresponding to the virtual image of the image device.

The method may further include displaying a menu bar which enables a selection of at least one of a category, a model, and a size of the image device, wherein the displaying the virtual image of the image device may include displaying the virtual image of the image device based on an input of the user received via the user interface to select the image device from the menu bar.

The method may further include, when a plurality of virtual images of a plurality of image device are displayed, entirely or partially deleting the plurality of virtual images of the plurality of image devices based on an input of the user received via the user interface to delete one or more of the plurality of virtual images of the plurality of image devices.

The method may further include displaying content on an area on which the virtual image of the image device is displayed based on an input of the user received via the user interface to select the content.

The method may further include storing a simulation result related to an installation of the image device as at least one of a video and a screenshot image.

BRIEF DESCRIPTION OF THE DRAWINGS

The above and other aspects, features, and advantages of example embodiments of the disclosure will be more apparent from the following description taken in conjunction with the accompanying drawings, in which:

FIGS. 14 to 16 illustrate an embodiment of displaying a virtual image of the image device on the grid.

FIG. 17 illustrates rotating and displaying the virtual image of the image device.

FIGS. 19 to 23 illustrate an embodiment of displaying a virtual image of an image device.

FIG. 24 illustrates displaying or hiding the grid.

FIGS. 27 to 29 illustrate playing of content on an area on which the virtual image of the image device is displayed.

DETAILED DESCRIPTION

Figure 1:
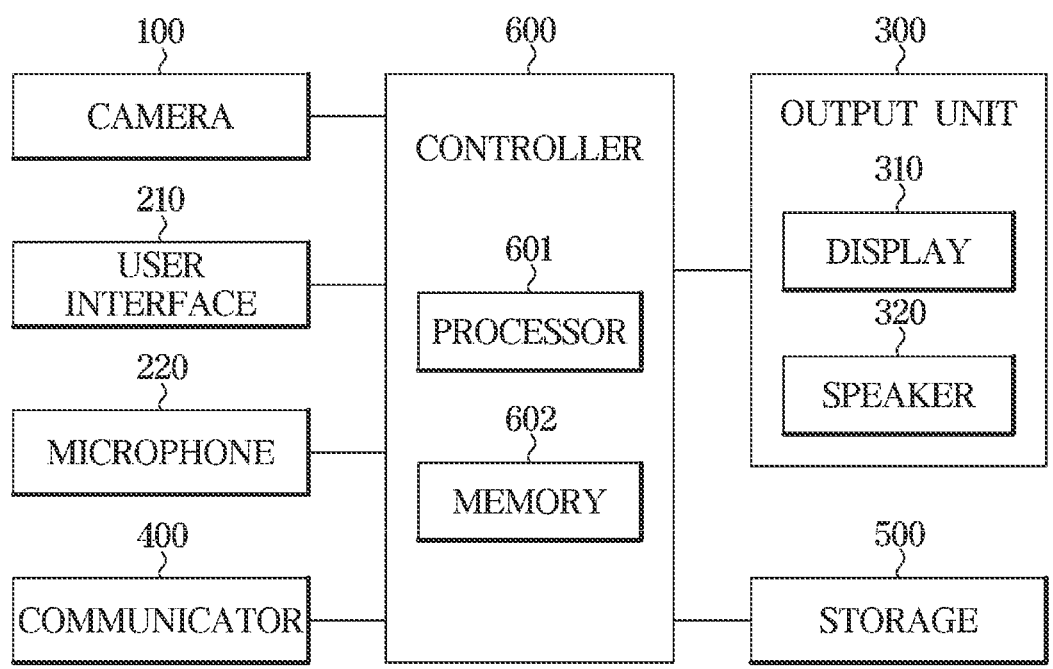
FIG. 1 is a control block diagram of a mobile device.

The embodiments disclosed herein and the components shown in the drawings are merely examples and various modifications capable of replacing the embodiments and drawings of the disclosure may be made. Terms used herein are used to illustrate the embodiments and are not intended to limit and/or to restrict the disclosure.

Terms such as "unit" used herein may be implemented as software or hardware. According to embodiments, a plurality of units may be implemented by a single unit or component, or a single unit may include a plurality of components. Further, terms described herein, such as "unit," "block," "member," and "module," may refer to a unit of processing at least one function or operation. For example, the terms may refer to hardware (e.g., a circuit), software stored in memory, or a process processed by a processor.

As used herein, a singular expression may include a plural expression unless otherwise stated in the context. In addition, terms such as "first" and "second" as used herein are used to distinguish one part from another part, and unless otherwise specified, they do not mean a sequential expression.

Terms such as "including," "having", or the like are intended to indicate the existence of the features, numbers, steps, operations, components, parts, or combinations thereof disclosed in the specification and are not intended to preclude the possibility that one or more other features, numbers, steps, operations, components, parts, or combinations thereof may exist or may be added.

Further, terms including ordinal numbers such as first, second, and the like are used to distinguish one component from another component, and the components are not limited by the terms.

Descriptions shall be understood as to include any and all combinations of one or more of the associated listed items when the items are described by using the conjunctive term "and/or," or the like. That is, the term "and/or" includes a plurality of combinations of relevant items or any one item among a plurality of relevant items. For example, the scope of the expression or phrase "A and/or B" includes all of the following: (1) the item "A", (2) the item "B", and (3) the combination of items "A and B".

In addition, the scope of the expression or phrase "at least one of A and B" is intended to include all of the following: (1) at least one of A, (2) at least one of B, and (3) at least one A and at least one of B. Likewise, the scope of the expression or phrase "at least one of A, B, and C" is intended to include all of the following: (1) at least one of A, (2) at least one of B, (3) at least one of C, (4) at least one of A and at least one of B, (5) at least one of A and at least one of C, (6) at least one of B and at least one of C, and (7) at least one of A, at least one of B, and at least one of C.

When it is stated in the disclosure that one element is "connected to" or "coupled to" another element, the expression encompasses an example of a direct connection or direct coupling, as well as a connection or coupling with another element interposed therebetween.

Hereinafter, example embodiments of the disclosure will be described in detail with reference to the accompanying drawings. The same reference numerals or symbols given in the accompanying drawings indicate parts or components performing substantially the same function.

Examples disclosed herein are directed to providing a mobile device and a method of controlling the mobile device, which enable a user to realistically simulate the installation of an image device by displaying a virtual image corresponding to the image device of an actual size together with an image of a real space in which the image device is to be installed.

According to a mobile device and a method of controlling the mobile device according to examples disclosed herein, a user can realistically simulate the installation of an image device by displaying a virtual image corresponding to the image device of an actual size together with an image of a real space in which the image device is to be installed.

Further, according to a mobile device and a method of controlling the mobile device according to examples disclosed herein, more realistic simulation can be performed by playing content on an area on which a virtual image corresponding to an image device of an actual size is displayed.

Figure 2:
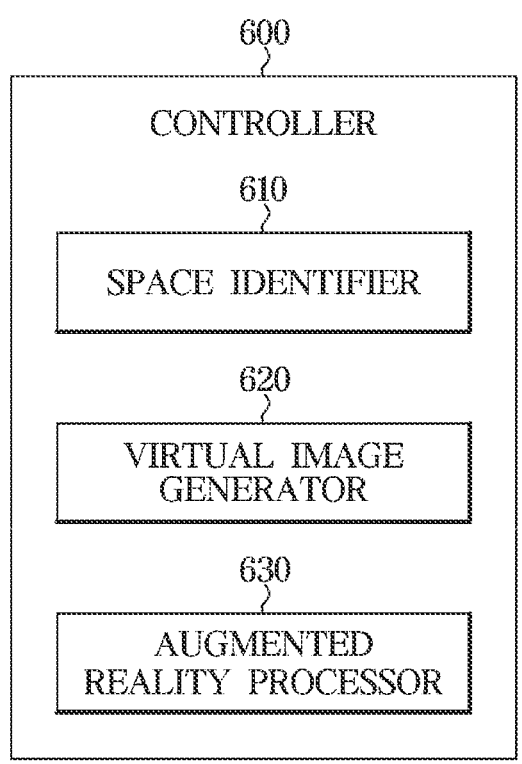
FIG. 2 is a detailed block diagram of a controller shown in FIG. 1.

FIG. 1 is a control block diagram of a mobile device according to an embodiment, and FIG. 2 is a detailed block diagram of a controller shown in FIG. 1.

First, a mobile device 1 according to one embodiment is a movable (portable) device and includes a device capable of providing augmented reality. For example, the mobile device 1 may be implemented as a device capable of providing augmented reality by including a camera, such as a mobile phone, a portable multimedia player (PMP), a digital broadcast player, a personal digital assistant (PDA), a music file player (e.g., an MP3 player), a portable game terminal, a tablet Personal Computer (PC), and a smart phone. Hereinafter, for convenience of description, it is assumed that the mobile device 1 is a smart phone.

Referring to FIG. 1, the mobile device 1 according to an embodiment may include a camera 100, a user interface 210, a microphone 220, an output unit 300, a communicator 400, a storage 500, and a controller 600.

The camera 100 may photograph a space in which an image device may be installed. The camera 100 may be a camera module that is mounted on the mobile device 1 and may include a lens, a charge-coupled device (CCD) or complementary metal oxide semiconductor (CMOS) image sensor, and an analog-to-digital converter. The camera 100 converts an image obtained by capturing a subject into a digital signal and transmits the digital signal to the controller 600. The controller 600, which will be described later, may perform processing on the image converted into the digital signal.

The user interface 210 receives an input of a user and transmits the received input to the controller 600. The user interface 210 may include various user input devices such as a key pad, a dome switch, a touch pad (static pressure/static electricity), a jog wheel, a jog switch, and the like.

Further, the user interface 210 may also include a display 310 including a touch panel. The user interface 210 may be treated in the same manner as the display 310, which senses an input of the user, such as a touch input, and simultaneously displays a processing result for the input of the user as an image. The user interface 210 may include a user interface (UI) element that is displayed on the display 310 and enables the control of the mobile device 1. Meanwhile, the input of the user may include a touch input and/or a gesture input.

The microphone 220 may receive an audio signal, convert the audio signal into an electrical signal, and transmit the electrical signal to the controller 600. The microphone 220 may receive a voice command of the user and transmit the received voice command to the controller 600, and the controller 600 may control the mobile device 1 in response to the voice command of the user.

The output unit 300 may be a device capable of outputting an image signal or an audio signal and may correspond to various devices. For example, the output unit 300 may include at least one of the display 310 and a speaker 320. The speaker 320 may output an audio signal associated with various functions of the mobile device 1.

The display 310 may display information input by the user or information provided to the user as various screens. The display 310 displays information that is processed by the controller 600. For example, the display 310 may display an image of a space photographed by the camera 100 and may display an augmented reality image in which a virtual image is superimposed on the image of the space. The display 310 may display graphical user interfaces (GUIs) related to various functions of the mobile device 1.

Further, the display 310 may also be used as an input device including a touch panel. The display 310 may be implemented as a liquid crystal display, a thin film transistor-liquid crystal display, an organic light-emitting diode (OLED), a flexible display, a 3-dimensional (3D) display, and the like.

The communicator 400 connects the mobile device 1 to an external device, a server, or the like through a network or a communication channel, for example via a wired and/or wireless method. The communicator 400 may include various communication modules. For example, the communicator 400 may include a communication module connectable to various communication networks such as Bluetooth, Zigbee, wireless local area network, home radio frequency (RF), ultra-wide band (UWB), and the Internet.

The storage 500 may store programs and data for controlling the operation of the mobile device 1. In addition, the storage 500 may store input/output data (e.g., text, photos, messages, still images, videos, and the like).

The storage 500 may correspond to a memory and may include a volatile memory such as a static random-access memory (S-RAM), a dynamic RAM (D-RAM), and the like and a non-volatile memory such as a read-only memory (ROM), an erasable programmable ROM (EPROM), an electrically erasable programmable ROM (EEPROM), and the like for long-term storage of data.

The controller 600 may include a processor 601 that generates a control signal for controlling the operation of the mobile device 1 using a program and data stored in the storage 500 and/or a memory 602. The processor 601 may include a logic circuit and an operational circuit, process the data on the basis of the program provided from the storage 500 and/or the memory 602, and generate a control signal according to the processing result. The controller 600 may be implemented as hardware, such as a circuit.

Further, the processor 601 and the memory 602 may be implemented as separate chips or may be implemented as a single chip. The controller 600 may also include a plurality of processors 601 and a plurality of memories 602.

Referring to FIG. 2, the controller 600 may include a space identifier 610, a virtual image generator 620, and an augmented reality processor 630. The space identifier 610, the virtual image generator 620, and the augmented reality processor 630 may be implemented as separate processors and may also be implemented as a single processor.

The space identifier 610 may identify a plane from the image of the space, in which the image device is to be installed, photographed by the camera 100, in response to an input of the user. For example, the space identifier 610 may distinguish and identify a wall surface W, a floor surface F, and a ceiling surface included in an image of a real space. The space identifier 610 may identify the plane on the basis of a guide line (12a, 12b, and/or 12c) to be described later.

The image device may have a planar or curved shape, but for convenience of description, it is assumed that the image device has a planar shape. In addition, the image device may be installed in various locations but is generally installed on a wall surface.

The image device refers to an electronic device capable of displaying an image. The image device may be a stand-alone device, such as a light-emitting diode (LED) TV, an OLED TV, or the like. In addition, the image device may also be a display module. The display module may be an LED module including at least one LED pixel or an LED cabinet in which a plurality of LED modules are connected. A plurality of display modules may be physically connected to form one screen. That is, the image device may include a device in which a plurality of display modules are connected and assembled.

Meanwhile, the image device may have various categories. For example, the image device may be classified into categories, such as digital signage, a stand-alone display, a modular-type display, a video wall, an outdoor device, an interactive device, a specialty device, and the like. Such categories of the image device may be determined depending on product characteristics, marketing requirements, and the like. In addition, each category may include a plurality of product models.

Further, the space identifier 610 may store data related to a plane, which is identified from an image of a specific space, in the storage 500/memory 602 and may retrieve the data related to the plane from the storage 500/memory 602. When the image of the space photographed by the camera 100 is the same as the image of the space stored in the storage 500/memory 602, the space identifier 610 may retrieve the data related to the plane, which is included in the photographed space, from the storage 500/memory 602.

As described above, since the mobile device 1 according to an embodiment may automatically identify the space or the plane in which the image device may be installed, the installation of the image device may be more easily simulated.

The virtual image generator 620 may generate a virtual image of an object. The generated virtual image of the object may interact with an input of the user, and the user may select, move, and change the virtual image of the object.

For example, the virtual image generator 620 may generate a grid 20 to be displayed on a virtual plane VP corresponding to the plane identified from the image of the space. The grid 20 is an image of a lattice pattern and is an image having a plurality of cells each having a predetermined size. A size of a cell 21 of the grid 20 may be changed on the basis of an input of the user, and the virtual image generator 620 may generate the grid 20 having the cell 21 of a changed size on the basis of the input of the user for changing the size of the cell 21. In addition, a pattern of the grid 20 may also be changed.

Further, the virtual image generator 620 may adjust the grid 20 on the basis of an input of the user. Adjusting the grid 20 is distinguished from changing the size of the cell 21. That is, adjusting the grid 20 means changing at least one of a location and a direction of the grid 20.

For example, the virtual image generator 620 may move the grid 20 on the basis of an input of the user. The virtual image generator 620 may match a start line of the grid 20 to a boundary line of the identified plane on the basis of an input of the user for adjusting the grid 20. The input of the user for moving the grid 20 may be a long touch and dragging of the grid 20 on the display 310.

Further, the virtual image generator 620 may rotate a direction of the grid 20 on the basis of the input of the user for adjusting the grid 20. The input of the user for rotating the direction of the grid 20 may be simultaneously touching two points of the grid 20 on the display 310 and dragging one point of the two points.

Further, the virtual image generator 620 may generate a virtual image 30 of the image device and a virtual content image VC that may be displayed around the virtual image of the image device. The content includes various types of data such as a photograph, a video, an audio, text, and the like, and the virtual content image VC is a virtual image including such content information. In addition, the content corresponding to the virtual content image VC may be content stored in the storage 500/memory 602 or may be content obtained from an external server or the like through the communicator 400.

The augmented reality processor 630 may display an image of a real space on the display 310 together with the virtual image. For example, the augmented reality processor 630 may generate an augmented reality image in which the image of the real space and the virtual image are superimposed on each other and display the generated augmented reality image on the display 310.

The augmented reality processor 630 may control the display 310 to display the guide line (12a, 12b, and/or 12c) together with the image of the space. The augmented reality processor 630 may display the grid 20 generated by the virtual image generator 620 on the virtual plane VP corresponding to the plane, which is identified from the image of the space photographed by the camera 100, and control the display 310 to display the virtual image 30 of the image device on the grid 20 together with the grid 20 on the basis of an input of the user. In addition, the augmented reality processor 630 may control the display 310 to display the image of the real space, the virtual image 30 of the image device, and the virtual content image VC together.

As described above, by displaying the virtual image corresponding to the image device of an actual size together with the image of the real space in which the image device is to be installed, the user may realistically simulate the installation of the image device.

Figure 3:
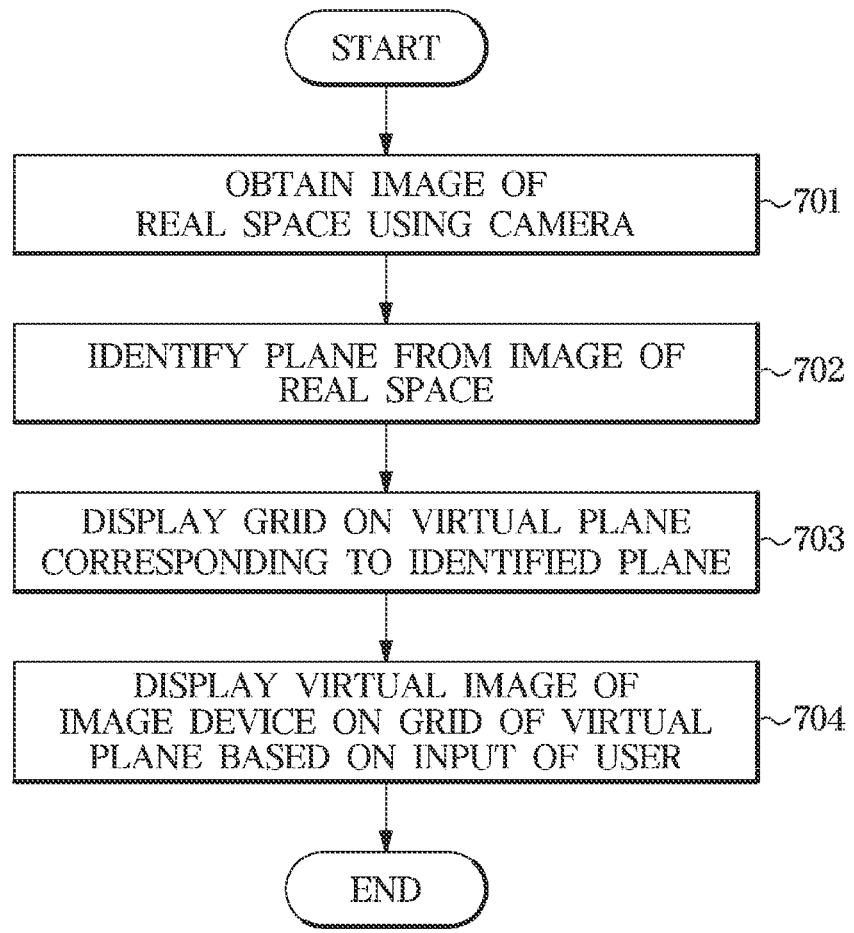
FIGS. 3 to 5 are flowcharts illustrating a method of controlling the mobile device.
Figure 4:
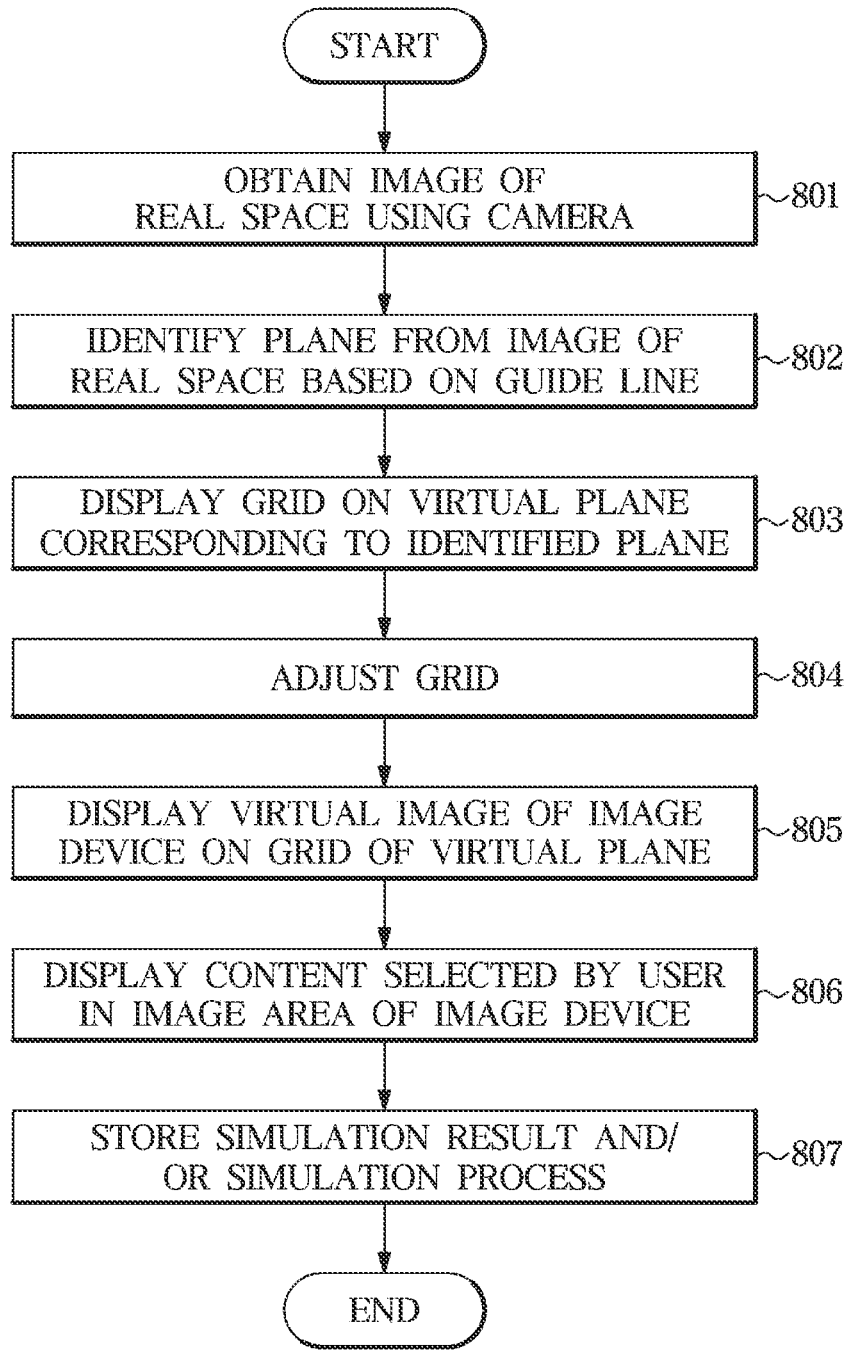
Figure 5:
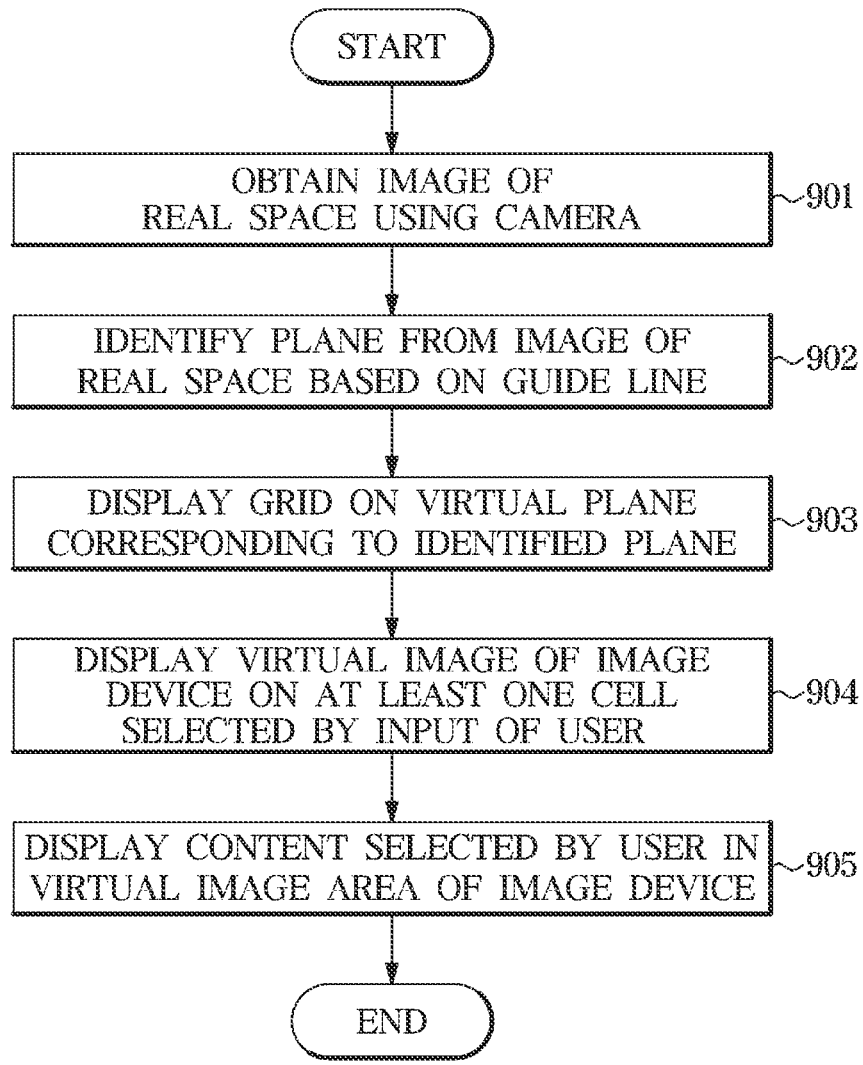

FIGS. 3 to 5 are flowcharts illustrating a method of controlling the mobile device.

FIG. 3 schematically illustrates displaying the grid and the virtual image of the image device.

Referring to FIG. 3, the camera 100 of the mobile device 1 obtains an image by photographing a real space in which an image device may be installed (701). The controller 600 identifies a plane from the image of the space photographed by the camera 100 (702). The controller 600 may control the display 310 to display a grid 20 on a virtual plane VP corresponding to the identified plane (703). For example, the controller 600 may display the grid 20 including a plurality of cells 21 each having a predetermined size on the virtual plane VP corresponding to the plane identified from the image of the photographed space. The controller 600 may control the display 310 to display a virtual image 30 of the image device on the grid 20 displayed on the virtual plane VP on the basis of an input of the user (704).

FIG. 4 further illustrates displaying content and storing a simulation result.

Referring to FIG. 4, the camera 100 of the mobile device 1 obtains an image by photographing a real space in which an image device may be installed (801). The controller 600 identifies a plane from the image of the space photographed by the camera 100 on the basis of guide lines 12a, 12b, and 12c (12) (802). The controller 600 may control the display 310 to display the image of the space together with the guide lines 12a, 12b, and/or 12c. In addition, the controller 600 may control the display 310 to display the guide line as a base guide line 12a or corner guide lines 12b and 12c.

The controller 600 controls the display 310 to display a grid 20 on a virtual plane VP corresponding to the identified plane (803). For example, the controller 600 may display the grid 20 including a plurality of cells 21 each having a predetermined size on the virtual plane VP corresponding to the plane identified from the image of the photographed space. The controller 600 may adjust the grid on the basis of an input of the user (804). The controller 600 controls the display 310 to display a virtual image 30 of the image device on the grid 20 displayed on the virtual plane VP on the basis of an input of the user (805).

Thereafter, the controller 600 may control the display 310 to display content on an area on which the virtual image 30 of the image device is displayed on the basis of an input of the user (806). For example, the controller 600 may generate at least one virtual content image VC around the virtual image 30 of the image device and control the display 310 to display one or more virtual content images VC on the basis of an input of the user for selecting the virtual image 30 of the image device through the user interface 210. The controller 600 may control the display 310 to display content corresponding to the selected virtual content image on the area where the virtual image 30 of the image device is displayed on the basis of an input of the user for selecting one of the one or more virtual content images VC.

Further, the controller 600 may store a simulation result related to the installation of the image device in the storage 500 and/or the memory 602 (807). The controller 600 may store the simulation result related to the installation of the image device as at least one of a video and a screenshot image. The controller 600 may store a simulation process and/or the simulation result as at least one of a video and a screenshot image on the basis of a command that is input through a recording icon 70 and/or a screenshot icon 80, which will be described later.

FIG. 5 illustrates a method of displaying a virtual image of an image device in more detail.

Referring to FIG. 5, the camera 100 of the mobile device 1 obtains an image by photographing a real space in which an image device may be installed (901). The controller 600 identifies a plane from the image of the space photographed by the camera 100 on the basis of guide lines 12a, 12b, and 12c (902). The controller 600 controls the display 310 to display a grid 20 on a virtual plane VP corresponding to the identified plane (903).

The controller 600 controls the display 310 to display a virtual image 30 of the image device on the grid 20 displayed on the virtual plane VP on the basis of an input of the user (904). For example, on the basis of an input of the user for selecting a specific area of the grid 20, the virtual image 30 of the image device may be displayed on the selected specific area of the grid 20. The controller 600 may control the display 310 to display the virtual image 30 of the image device having a predetermined size on the selected specific area of the grid 20.

In addition, on the basis of an input of the user for selecting at least one cell 21, the controller 600 may control the display 310 to display the virtual image 30 of the image device on the selected at least one cell 21. That is, the virtual image 30 of the image device having a size corresponding to the number of selected cells 21 may be displayed.

Thereafter, the controller 600 may control the display 310 to display content on an area on which the virtual image 30 of the image device is displayed on the basis of an input of the user (905). For example, the controller 600 may generate at least one virtual content image VC around the virtual image 30 of the image device and control the display 310 to display one or more virtual content images VC on the basis of an input of the user for selecting the virtual image 30 of the image device through the user interface 210. The controller 600 may control the display 310 to display content corresponding to the selected virtual content image on the area where the virtual image 30 of the image device is displayed on the basis of an input of the user for selecting one of the one or more virtual content images VC.

As described above, a realistic simulation of the installation of the image device may be performed by displaying the virtual image corresponding to the image device of an actual size together with the image of the real space in which the image device may be installed and playing the content in the area of the virtual image corresponding to the image device of an actual size.

Meanwhile, the controller 600 may obtain purchase information of a real image device corresponding to the virtual image 30 of the image device from an external server (not shown) and control the display 310 to display the purchase information of the image device together with the virtual image 30 of the image device. Since the user may purchase and install the same image device that the user has simulated him or herself, the user may minimize an error that may occur when the image device is actually installed.

Hereinafter, additional features will be described in more detail with reference to FIGS. 6 to 29.

Figure 6:
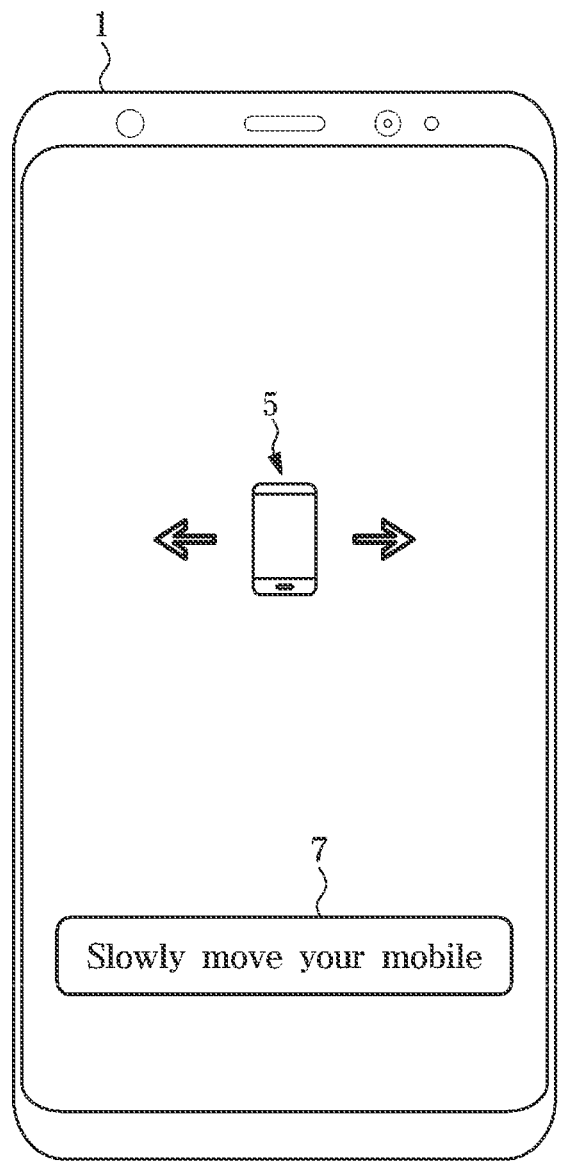
FIG. 6 illustrates a method of starting a simulation related to the installation of the image device.

FIG. 6 illustrates a method of starting a simulation related to the installation of the image device.

Referring to FIG. 6, the simulation related to the installation of the image device may be performed by executing or driving an application installed in the mobile device 1. When the application is executed or driven, the controller 600 may control the display 310 to display an icon 5 and a pop-up message 7, which are configured to guide a movement of the mobile device 1, in order to start an identification of a plane in a space in which an image device may be installed.

When the movement of the mobile device 1 is detected, the controller 600 may stop displaying the icon 5 and the pop-up message 7 configured to guide the movement of the mobile device 1. The mobile device 1 may include a sensor for detecting the movement.

Thereafter, the controller 600 may control the display 310 to display guide lines 12a, 12b, and 12c, for example, according to a context or a physical configuration of the space in which the image device is to be installed. However, displaying the pop-up message 7 and the icon 5 configured to guide the movement of the mobile device 1 may be omitted. In other words, when the simulation related to the installation of the image device is started, the space in which the image device may be installed may be photographed by the camera 100, and a process of identifying the plane from the image of the photographed space may be immediately started.

Figure 7:
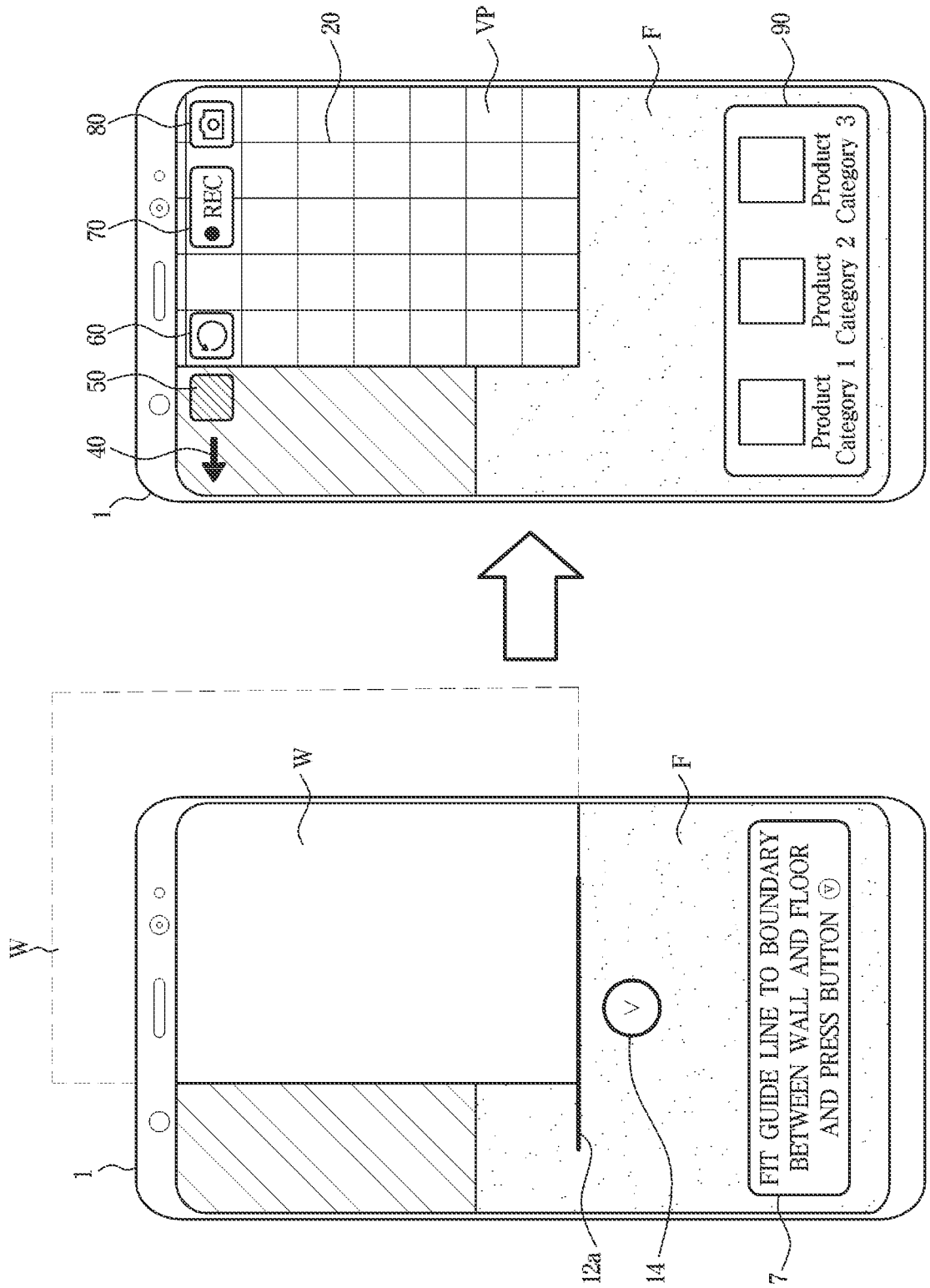
FIGS. 7 to 9 illustrate a method of identifying a plane from an image of a space in which the image device may be installed and displaying a grid.
Figure 8:
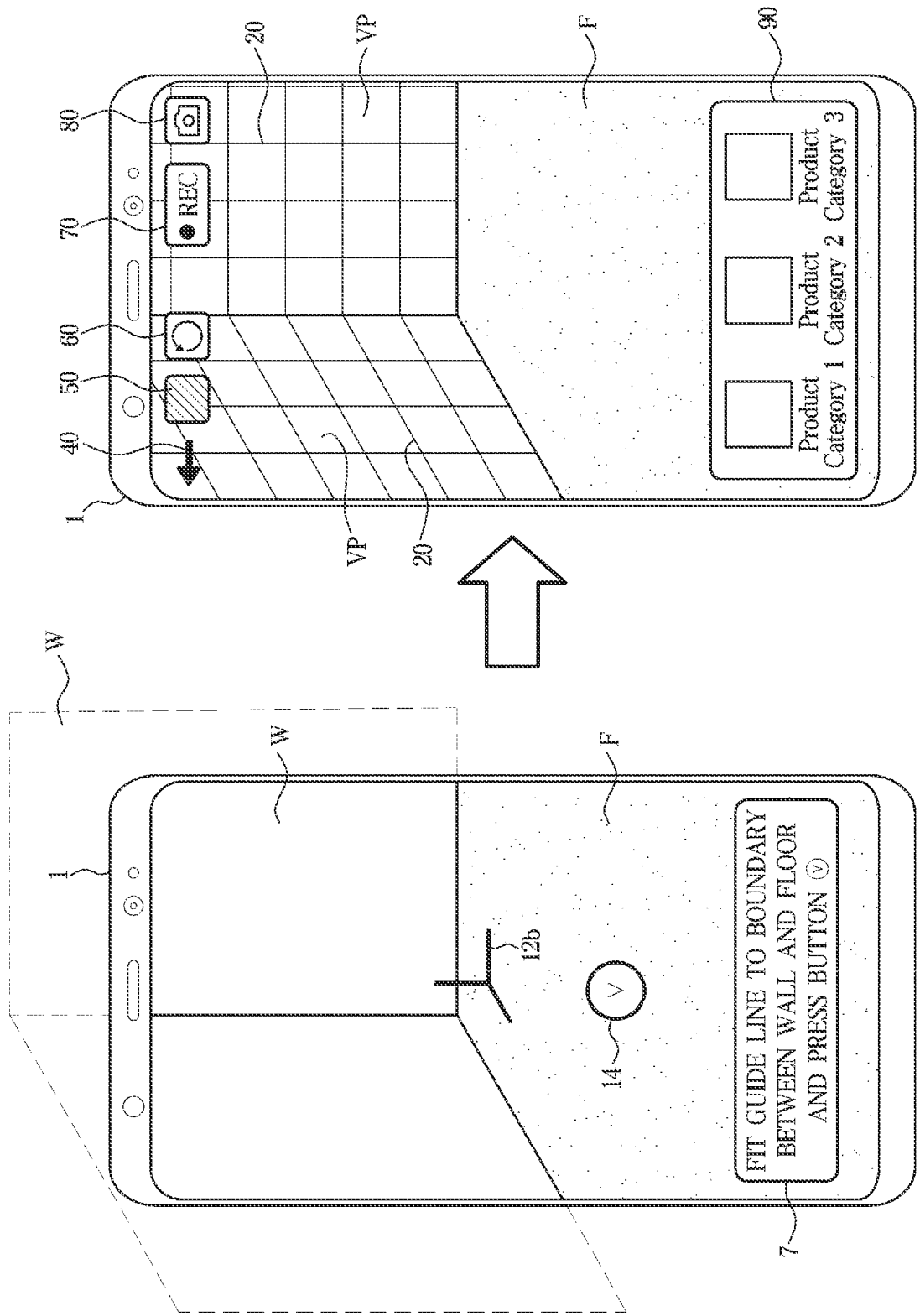
Figure 9:
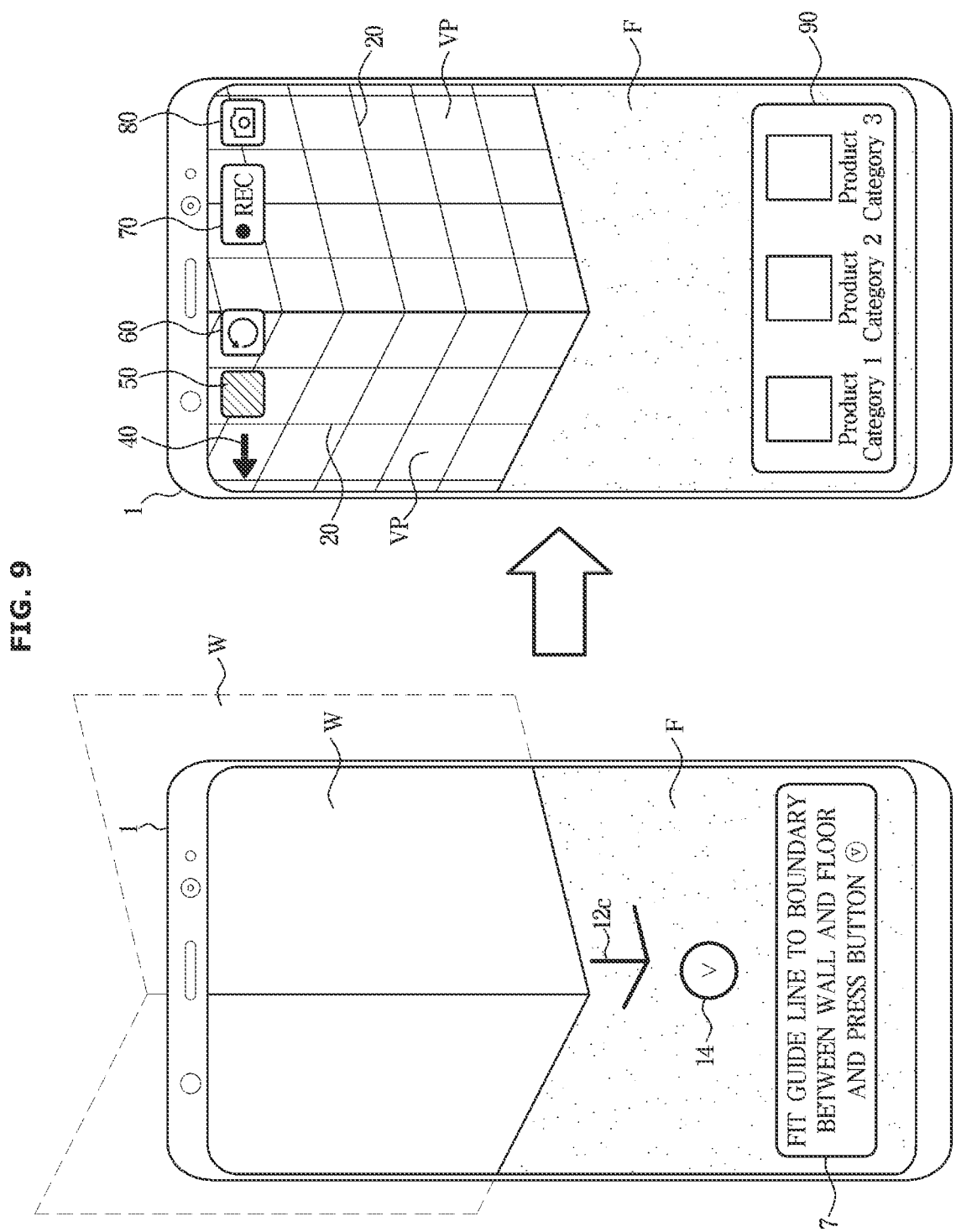

FIGS. 7 to 9 illustrate a method of identifying the plane from the image of the space in which the image device may be installed and displaying a grid.

Referring to FIG. 7, the controller 600 may control the display 310 to display a base guide line 12a for identifying the plane. The controller 600 may display the image of the space photographed by the camera 100 on the display 310 together with the base guide line 12a and may identify the plane on the basis of the guide line 12a.

For example, when the base guide line 12a displayed on the display 310 is fitted to a boundary between a wall surface W and a floor surface F, the controller 600 may identify an upper surface with respect to the base guide line 12a as the wall surface W and identify a lower surface with respect to the base guide line 12a as the floor surface F. The controller 600 may control the display 310 to display a grid 20 on the identified wall surface W.

The controller 600 may display a pop-up message 7, which includes a guide sentence instructing the user to fit the base guide line 12a to the boundary between the wall surface W and the floor surface F, through the display 310. In addition, the controller 600 may control the display 310 to further display a confirmation button 14 below the base guide line 12a. On the basis of an input of the user for pressing the confirmation button 14, the controller 600 may determine that the base guide line 12a is fitted to the boundary between the wall surface W and the floor surface F and may identify the wall surface W. In addition, even when there is no input for the confirmation button 14, the controller 600 may automatically identify the wall surface W when the base guide line 12a is fitted to the boundary between the wall surface W and the floor surface F.

The controller 600 may generate a virtual plane VP corresponding to the wall surface W that is an identified plane. In addition, the controller 600 may control the display 310 to display the grid 20 on the virtual plane VP. The grid 20 may include a plurality of cells 21 each having a predetermined size.

Meanwhile, the controller 600 may control the display 310 to display a return icon 40 to which a command for returning to a previous screen may be input, a pattern icon 50 to which a command for changing a pattern of the grid 20 and/or a command for turning the display of the grid 20 on or off may be input, a restart icon 60 to which a command for performing the plane identification again and/or a command for deleting the virtual image 30 of the image device may be input, a recording icon 70 to which a command for storing a simulation process and/or a simulation result as a video may be input, and a screenshot icon 80 to which a command for storing the simulation process and/or the simulation result as a screenshot image may be input.

Further, the controller 600 may control the display 310 to display a menu bar 90 that enables the selection of a category, a model, and a size of the image device. The image device may have various categories. For example, the image device may be classified into categories, such as digital signage, a stand-alone display, a video wall, an outdoor device, an interactive device, a specialty device, and the like. Such categories of the image device may be determined depending on product characteristics, marketing requirements, and the like. In addition, each category may include a plurality of product models. In addition, each product model may have different sizes.

Referring to FIGS. 8 and 9, the controller 600 may control the display 310 to display corner guide lines 12b and 12c for identifying a plane at a corner of the space. The controller 600 may display the image of the space photographed by the camera 100 on the display 310 together with the corner guide lines 12b and 12c and may identify the plane with respect to the corner guide lines 12b and 12c. The controller 600 may control the display 310 to display the base guide line 12a or the corner guide lines 12b and 12c on the basis of an input of the user for changing the guide line.

Referring to FIG. 8, when a first corner guide line 12b, which is displayed on the display 310, is fitted to the boundary between the wall surface W and the floor surface F and a location at which the wall surface W is bent inward, the controller 600 may identify both upper surfaces with respect to the first corner guide line 12b as left and right wall surfaces W and identify a lower surface with respect to the first corner guide line 12b as the floor surface F. The controller 600 may control the display 310 to display the grid 20 on the identified left and right wall surfaces W.

Referring to FIG. 9, when a second corner guide line 12c, which is displayed on the display 310, is fitted to the boundary between the wall surface W and the floor surface F and a location at which the wall surface W is bent outward, the controller 600 may identify both upper surfaces with respect to the second corner guide line 12c as left and right wall surfaces W and identify a lower surface with respect to the second corner guide line 12c as the floor surface F. The controller 600 may control the display 310 to display the grid 20 on the identified left and right wall surfaces W.

The first corner guide line 12b and the second corner guide line 12c may be displayed as icons, such as a three-dimensional coordinate axis (x-axis, y-axis, and z-axis) and may have different shapes. For example, the first corner guide line 12b may have a shape having three line segments that connect triangular vertices and a triangular center. The second corner guide line 12c may have a downward arrow shape.

Meanwhile, when a viewpoint of the camera 100 moves, the grid 20 may be continuously displayed. For example, when the plane is identified and the grid 20 is displayed on a virtual plane VP corresponding to the plane, and then the viewpoint of the camera 100 moves, the controller 600 may control the display 310 to continuously display the grid 20 on the plane as the viewpoint of the camera 100 moves.

Since the wall surface W may have a wider surface than that displayed on the display 310 through the camera 100, the controller 600 may generate the virtual plane VP having a wider area than the plane existing in a field of view of the camera 100. The grid 20 may be understood as being displayed throughout the virtual plane VP. Thus, even when the viewpoint of the camera 100 moves, the grid 20 may be continuously displayed. In this case, the three-dimensional coordinate axis on which the grid 20 is displayed is not changed.

As described above, since the space or plane in which the image device may be installed may be automatically identified, the installation of the image device may be more easily simulated. In addition, a size of the image device to be installed may be easily grasped by displaying the grid on the plane on which the image device may be installed. A more realistic simulation may be achieved by displaying the virtual image of the image device whose size is the same as that of the real image device.

Figure 10:
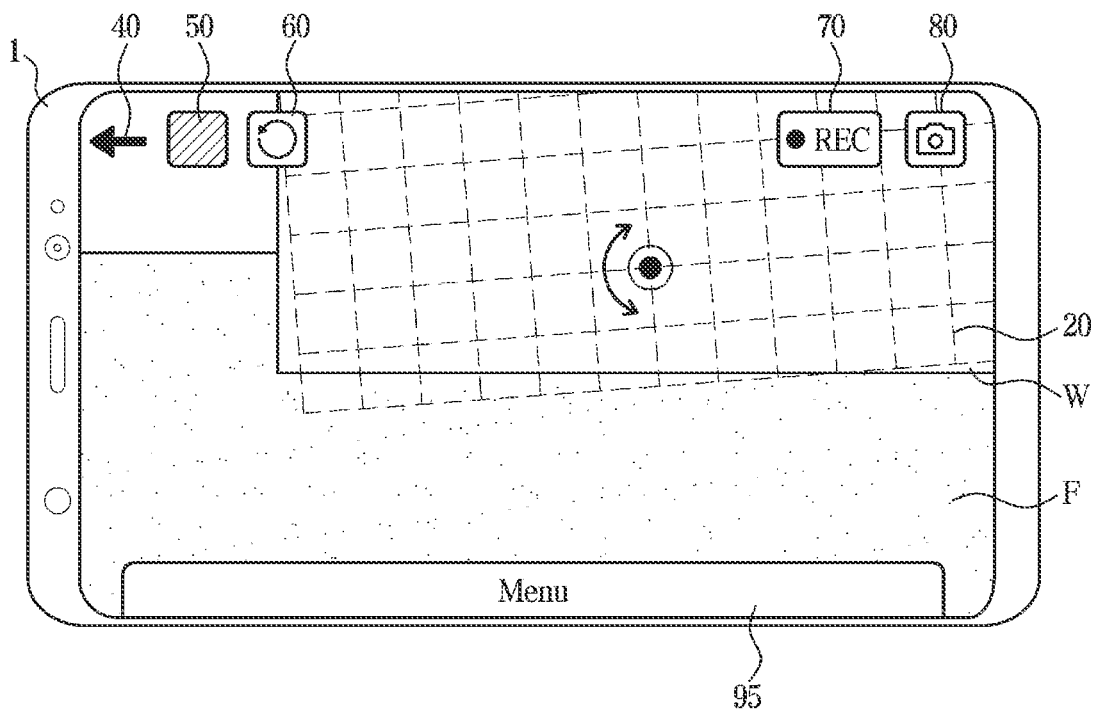
FIGS. 10 to 12 illustrate a method of adjusting the grid.
Figure 11:
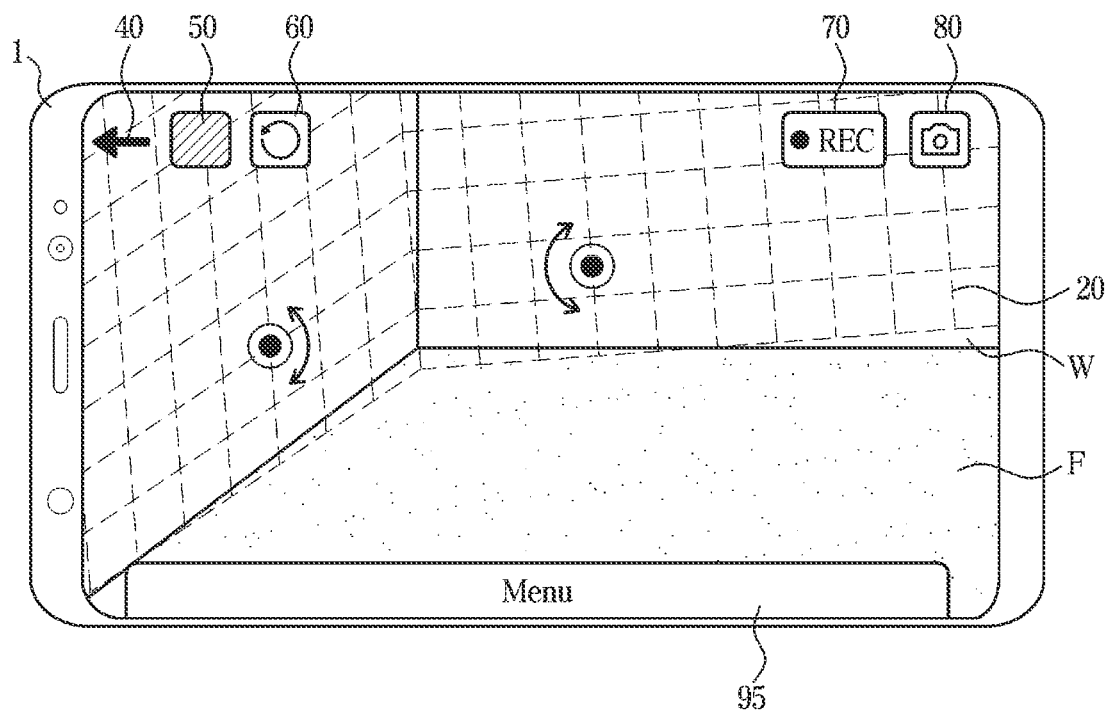
Figure 12:
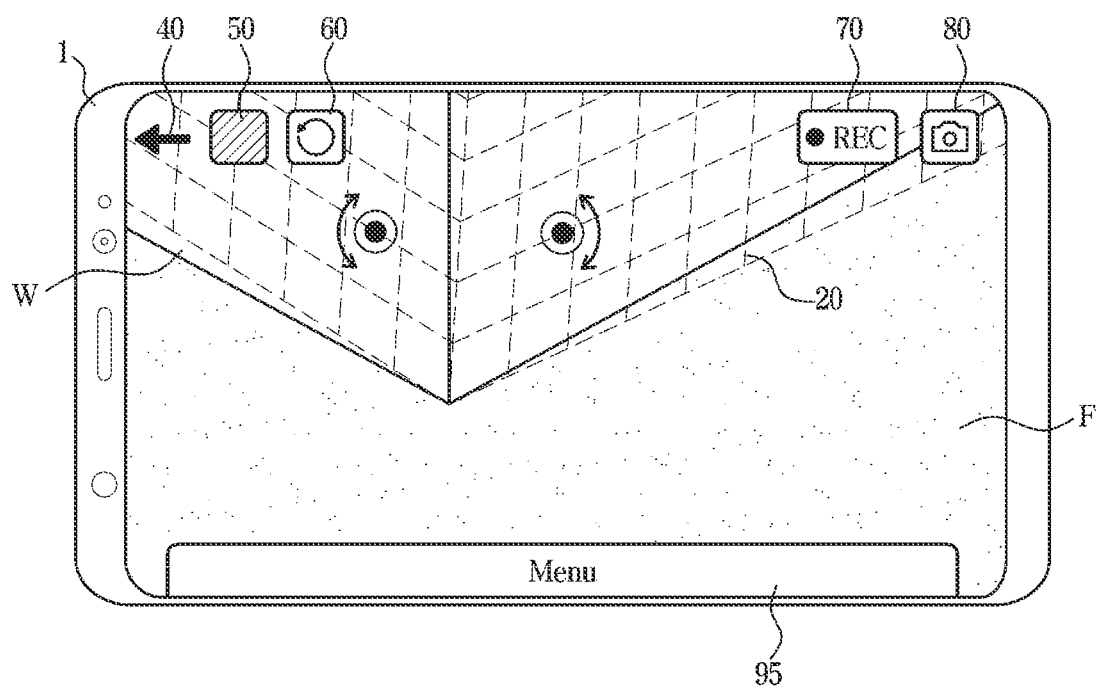

FIGS. 10 to 12 illustrate a method of adjusting the grid.

Referring to FIGS. 10 to 12, the grid 20 may be displayed as being deviated from the wall surface in the space. This phenomenon may be due to an error occurring in the process of identifying the plane in the space. Thus, when the grid 20 is displayed as being deviated from the identified plane, a function of adjusting the grid 20 is necessary.

FIG. 10 may continue from FIG. 7. Referring to FIG. 10, the controller 600 may move the grid 20 on the basis of an input of the user. Meanwhile, the input of the user includes a touch input and/or a gesture input. For example, the controller 600 may change at least one of a location and a direction of the grid 20 on the basis of an input of the user for adjusting the grid 20. The controller 600 may match a start line of the grid 20 to a boundary of the identified plane on the basis of an input of the user for moving the grid 20. The input of the user for moving the grid 20 may be a long touch and dragging of the grid 20 on the display 310. When the grid 20 is long touched (e.g., touched for a period of time greater than or equal to a preset period of time), the grid 20 may be displayed in a movable state. For example, the grid 20 may be changed to be a dotted line. A color of the grid 20 may be changed.

In addition, the controller 600 may rotate a direction of the grid 20 on the basis of an input of the user for rotating the direction of the grid 20. The input of the user for rotating the direction of the grid 20 may be to simultaneously touch two points of the grid 20 on the display 310 and to drag one point of the two points. For example, the direction of the grid 20 may be rotated to the left in a range from 0° to 180°. In addition, the direction of the grid 20 may be rotated to the right in a range from 0° to 180°.

FIG. 11 may continue from FIG. 8, and FIG. 12 may continue from FIG. 9.

Referring to FIGS. 11 and 12, the grid 20 may be displayed as being deviated from the left and right wall surfaces W. In this case, the controller 600 may move or rotate the entire grid 20 on the basis of an input of the user. In addition, the controller 600 may independently control the grid 20 corresponding to the left wall surface and the grid 20 corresponding to the right wall surface. That is, the controller 600 may independently control the grid 20 corresponding to each plane on the basis of the input of the user.

As described in FIG. 10, the controller 600 may match the start line of the grid 20 to the boundary of the identified plane on the basis of the input of the user for moving the grid 20. The input of the user for moving the grid 20 may be a long touch and dragging of the grid 20 on the display 310. When the grid 20 is long touched, the virtual plane VP including the corresponding grid 20 may be displayed in a movable state. For example, the grid 20 may be changed to be a dotted line. A color of the grid 20 may be changed.

The input of the user for rotating the direction of the grid 20 may be to simultaneously touch two points of the grid 20 on the display 310 and to drag one point of the two points. For example, the direction of the grid 20 may be rotated to the left in a range from 0° to 180°. In addition, the direction of the grid 20 may be rotated to the right in a range from 0° to 180°.

Meanwhile, the menu bar 90 may be hidden. In other words, the controller 600 may control the display 310 to hide the menu bar 90 and display a menu indicator 95 on the basis of an input of the user for closing the menu bar 90. Further, the controller 600 may switch the menu bar 90 to the menu indicator 95 when a predetermined time has passed. In addition, the controller 600 may switch the menu bar 90 to the menu indicator 95 in response to a specific function (e.g., a function of rotating the virtual image of the image device) being performed. In contrast, the controller 600 may control the display 310 to display the menu bar 90 on the basis of an input of the user for opening the menu bar 90 while the menu indicator 95 is displayed.

Figure 13:
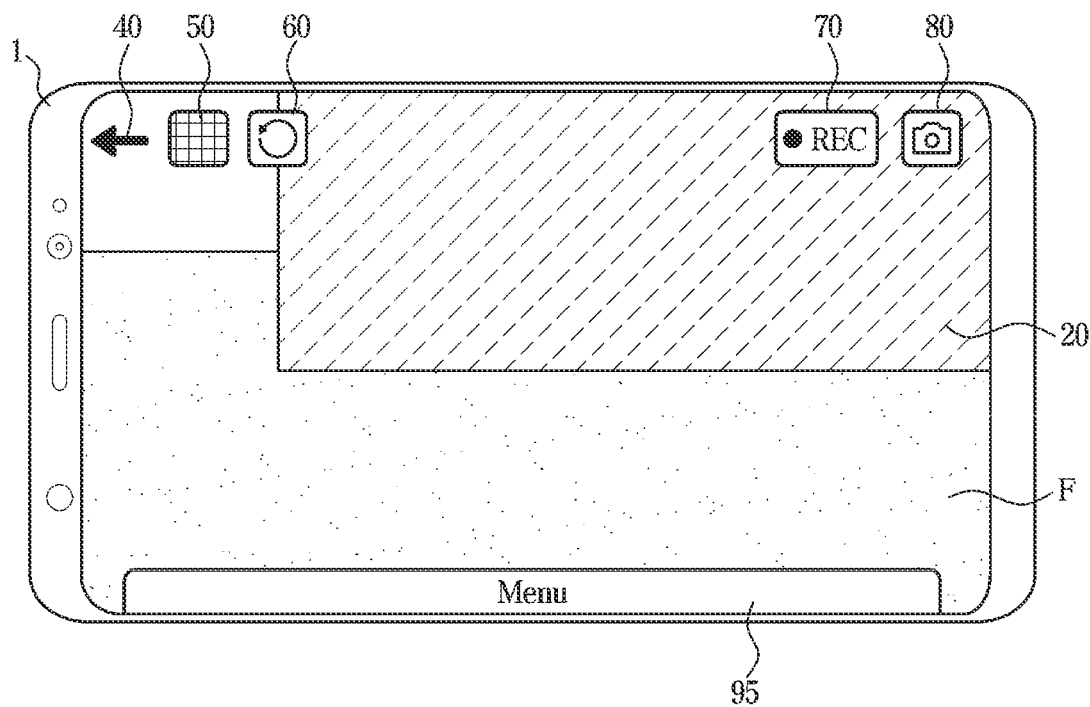
FIG. 13 illustrates changing a pattern of the grid.

FIG. 13 illustrates changing the pattern of the grid.

Referring to FIG. 13, the controller 600 may change the pattern of the displayed grid 20. For example, the grid 20 may be displayed in a square pattern, a rectangular pattern, or a diagonal pattern. The pattern of the grid 20 may be variously set without being limited thereto. The diagonal pattern may be selected to more easily distinguish the virtual image 30 of the image device from the identified plane (e.g., the wall surface W).

The controller 600 may change the pattern of the grid 20 on the basis of an input of the user. In addition, the controller 600 may turn the display of the grid 20 on or off on the basis of an input of the user. When the user touches the pattern icon 50, the grid 20 of a square pattern may be changed to the grid 20 of a diagonal pattern. In addition, when the user touches the pattern icon 50 again, the display of the grid 20 may be turned off. In other words, using the pattern icon 50, a command to change the pattern of the grid 20 and/or a command to turn the display of the grid 20 on or off may be input.

Figure 14:
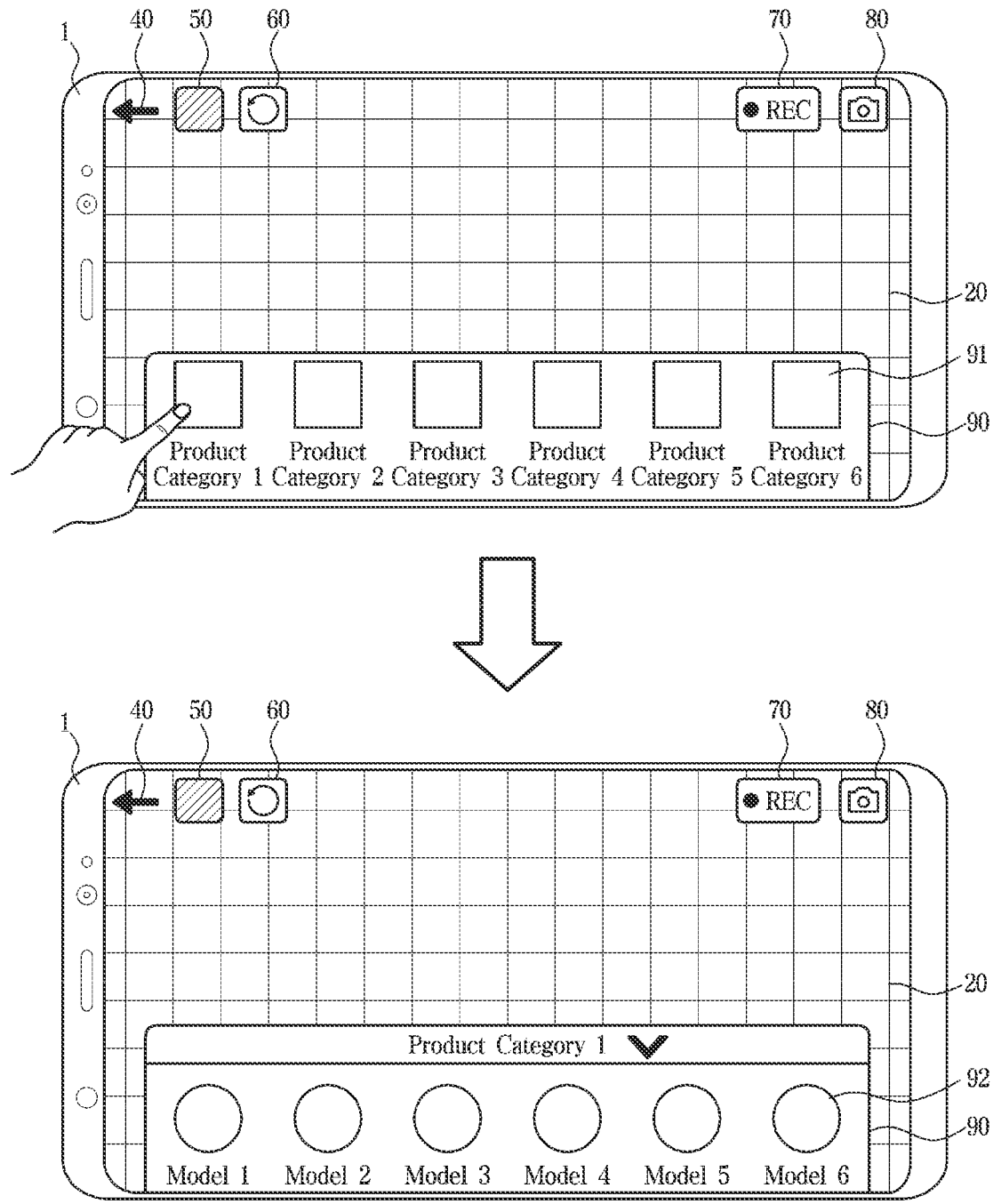

FIGS. 14 to 16 illustrate an embodiment of displaying a virtual image of an image device on a grid. FIG. 17 illustrates rotating and displaying the virtual image of the image device.

Referring to FIG. 14, as described above, the controller 600 may control the display 310 to display a menu bar 90 that enables the selection of a category, a model, and a size of the image device. In addition, the controller 600 may control the display 310 to display a virtual image 30 of an image device on the basis of an input of the user for selecting the image device from the menu bar 90.

The menu bar 90 may include a plurality of category icons 91. In addition, the plurality of category icons 91 may be scrolled (e.g., scrolled horizontally and/or vertically). When the number of category icons 91 is greater than the number of category icons 91 that may be displayed on the menu bar 90 area, the category icons 91 that are not displayed on the menu bar 90 may be exhibited or viewed through a scroll (e.g., a horizontal scroll and/or a vertical scroll) input by the user.

In addition, each category may include a plurality of product models. On the basis of an input of the user for selecting one of the plurality of category icons 91, the controller 600 may control the display 310 to display a plurality of model icons 92 included in the selected category. For example, when the user selects a first category, a model icon 92 representing a plurality of models included in the first category may be displayed on the menu bar 90. In this case, category information may be displayed on an upper end of the menu bar 90. The plurality of model icons 92 may also be scrolled (e.g., scrolled horizontally and/or vertically).

Referring to FIG. 15, the controller 600 may control the display 310 to further display a size icon 93, which enables a size of the image device to be selected, and a rotation icon 94, which enables the virtual image 30 of the image device to be rotated, on the menu bar 90. On the basis of an input of the user for selecting one (e.g., Model 1) of the plurality of model icons 92, the controller 600 may control the display 310 to display the size icon 93 that enables a size of the selected model (e.g., Model 1) to be selected.

Referring to FIG. 16, the controller 600 may control the display 310 to display a plurality of size icons 93a, 93b, and 93c. When the size icon 93 is displayed on the menu bar 90, category information and model information may be displayed on the upper end of the menu bar 90. When the user selects a particular size, the virtual image 30 of the image device having the selected size may be displayed on the grid 20.

Further, on the basis of an input of the user for selecting a specific area of the grid 20, the controller 600 may control the display 310 to display the virtual image 30 of the image device on the specific area of the grid 20. For example, when the user touches the icon 93b of a 46-inch size and touches a specific area of the grid 20, the virtual image 30 of the image device corresponding to the Model 1 having a 46 inch size may be displayed on the specific area of the grid 20. The specific area may refer to at least one cell 21 included in the grid 20. In addition, the controller 600 may move the displayed virtual image 30 of the image device on the basis of an input of the user.

Further, the controller 600 may control the display 310 to further display text including at least one of a model name, a size, a resolution, and a distance from a floor of the image device corresponding to the displayed virtual image 30 of the image device. In FIG. 16, text indicating that the model name is Model 1 and the size is 46 inches is displayed on an upper end of the virtual image 30 of the image device, and text indicating that the distance from the floor is 1 m is displayed.

Referring to FIG. 17, on the basis of an input of the user for rotating the virtual image 30 of the image device, the controller 600 may control the display 310 to display the rotated virtual image 30 of the image device on the virtual plane VP. For example, when there is an input of the user for touching the rotation icon 94 in the state in which the virtual image 30 of the image device is displayed, the virtual image 30 of the image device may be rotated by 90° in a leftward or rightward direction.

In addition, the controller 600 may rotate the virtual image 30 of the image device on the basis of a gesture of the user input to the area on which the virtual image 30 of the image device is displayed. For example, when there is an input of the user for simultaneously touching two points of the virtual image 30 of the image device and dragging one of the two points, the virtual image 30 of the image device may be rotated. For example, the virtual image 30 of the image device may rotate in the leftward or rightward direction in a range from 0° to 90°. The controller 600 may switch the menu bar 90 to the menu indicator 95 in response to rotating the virtual image of the image device.

Meanwhile, even when the user moves the mobile device 1 to change a direction in which the camera 100 faces after the virtual image 30 of the image device is displayed, the virtual image 30 of the image device may be viewed as if the virtual image 30 is fixed to the wall surface of the real space.

Figure 18:
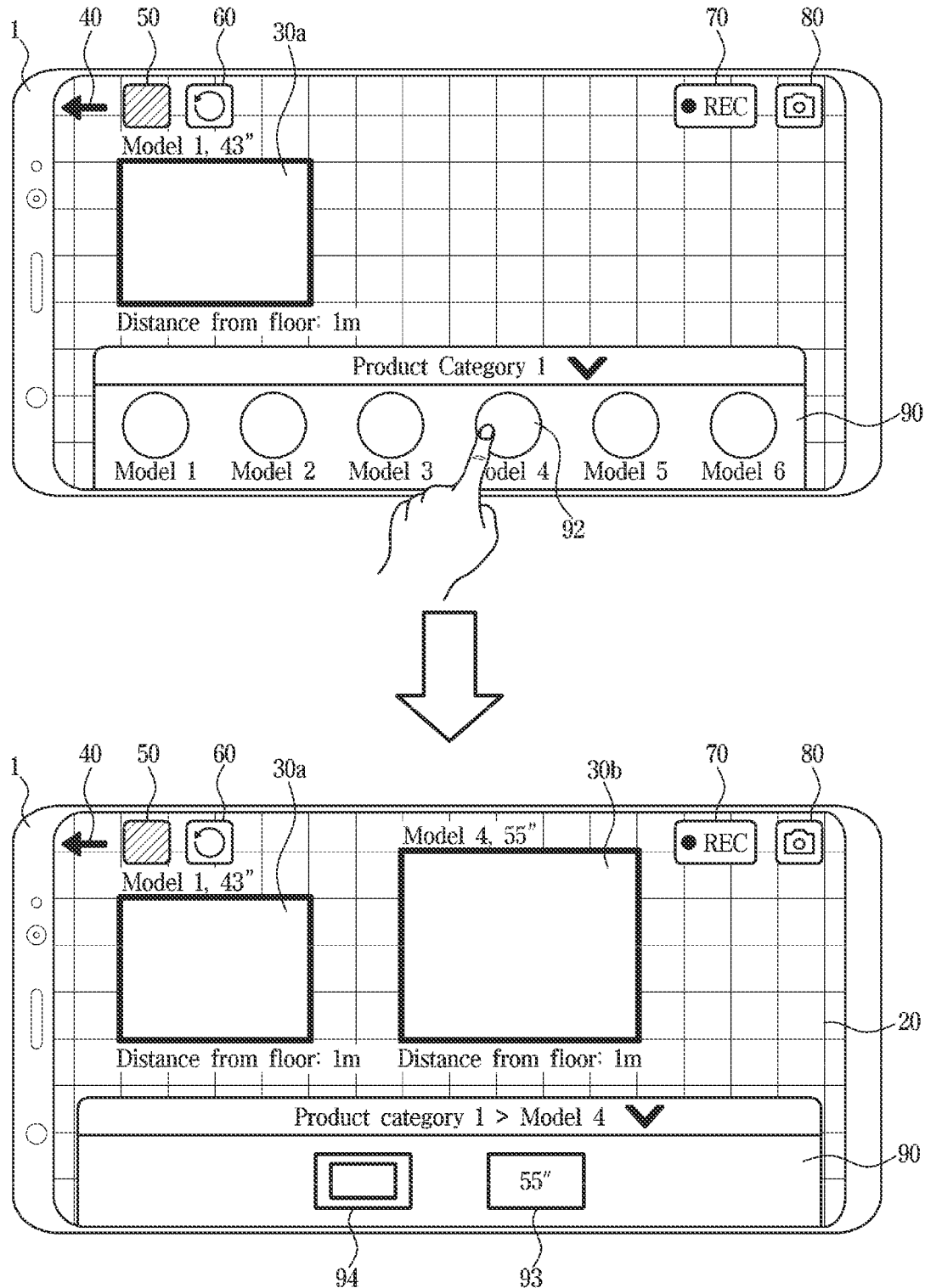
FIG. 18 illustrates displaying a plurality of virtual images of image devices.

FIG. 18 illustrates displaying a plurality of virtual images of image devices.

Referring to FIG. 18, the controller 600 may control the display 310 to display a plurality of virtual images 30 of image devices on the basis of an input of the user for additionally selecting the image device. For example, when there is an input of the user for selecting Model 4 of the same category (e.g., Category 1) and selecting a size of Model 4 (e.g., 55 inches) in a state in which a virtual image 30a of a first image device is displayed, the controller 600 may display a virtual image 30b of a second image device in an area, which does not overlap the virtual image 30a of the first image device, through the display 310. In addition, as described above, on the basis of an input of the user for selecting a specific area of the grid 20, the virtual image 30b of the second image device may be displayed on the specific area of the grid 20.

Although the case of additionally displaying the virtual image of the image device related to another model of the same category has been described, when an image device included in another category is selected, virtual images of a plurality of image devices included in different categories may be displayed.

Further, the controller 600 may control the display 310 to display another grid 20 depending on the category or model of the image device. For example, the grid 20 having the cell 21 of a first size may be displayed when Model 1 is selected, and the grid 20 having the cell 21 of a second size may be displayed when Model 2 is selected.

As such, the installation of image devices having various categories, various models, and various sizes may be simulated so that the installation of the image device may be more easily simulated. In addition, a utilization level as a simulation tool may be increased.

FIGS. 19 to 23 illustrate an embodiment of displaying a virtual image of an image device.

A method of displaying a virtual image of an image device described below may be more useful when a category of the image device is a category of connecting a plurality of display modules (e.g., digital signage). One cell 21 of a grid 20 may correspond to one display module.

Figure 19:
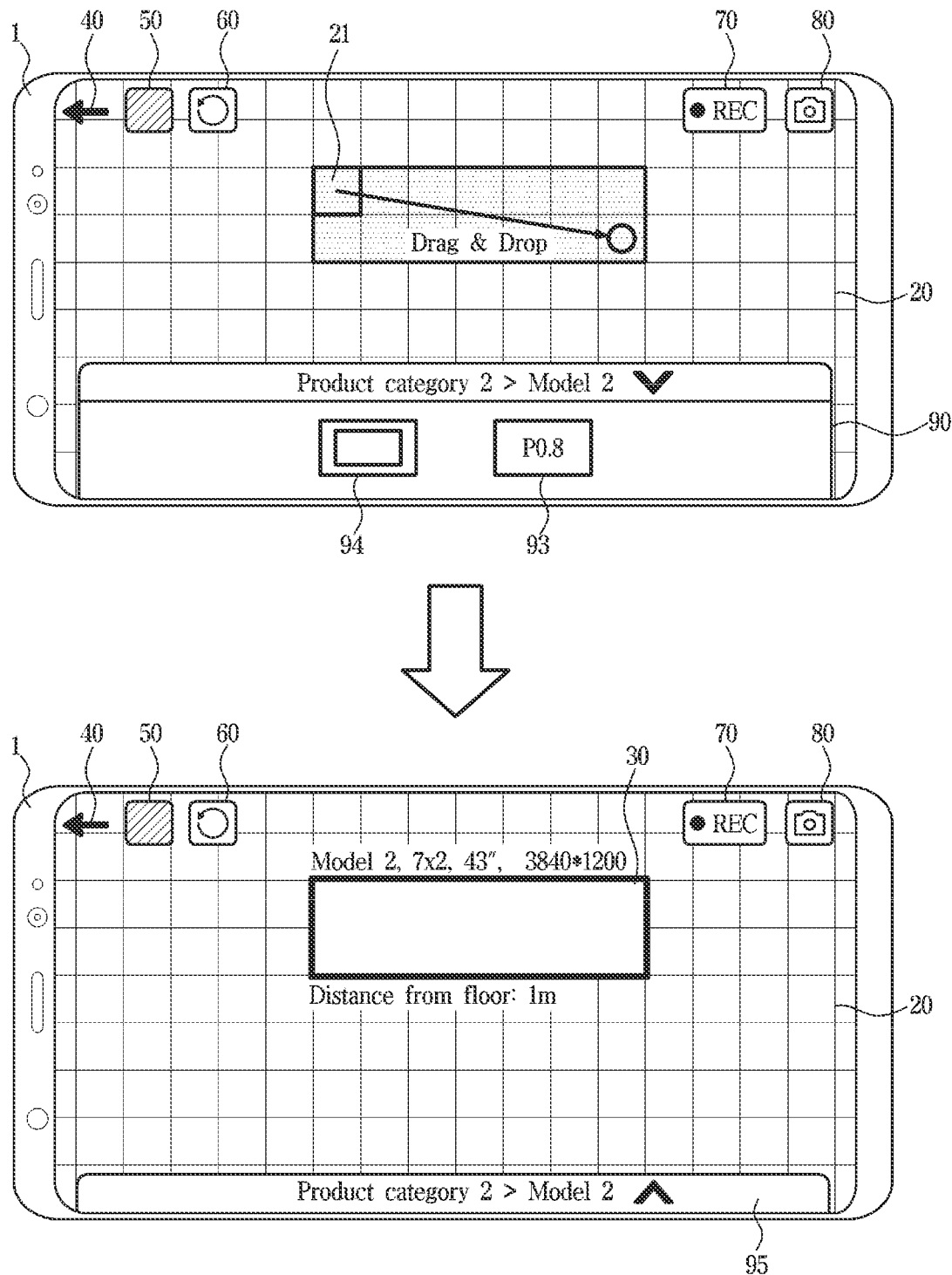

Referring to FIG. 19, on the basis of an input of the user for selecting at least one cell 21 included in the grid 20, the controller 600 may control the display 310 to display a virtual image 30 of the image device on the selected at least one cell 21. For example, the user may select a plurality of cells 21 by touching the cells 21 at an arbitrary location on the grid 20 and dragging and dropping the cells 21. The controller 600 may generate the virtual image 30 of the image device having a size corresponding to the selected plurality of cells 21 and display the virtual image 30 on the display 310.

Meanwhile, the display module may include a plurality of LED pixels. A pitch refers to a distance between the LED pixels. In addition, the smaller the pitch, the higher a resolution. A size icon 93 may display the pitch. The user may select the category, model, and pitch of the image device to be simulated from a menu bar 90. In FIG. 19, Model 2 belonging to Category 2 (e.g., digital signage) and having a pitch of 0.8 is selected. Thereafter, the controller 600 may switch the menu bar 90 to a menu indicator 95.

The virtual image 30 of the image device may be displayed after the plurality of cells 21 are selected or sequentially displayed according to the order of the selected cells 21 while the plurality of cells 21 are being selected. In addition, the controller 600 may control the display 310 such that the selected cells 21 may be distinguished and displayed while the plurality of cells 21 are being selected. For example, a color of the selected cells 21 may be changed and displayed.

FIG. 19 illustrates the virtual image 30 of the image device having a size (43 inches) corresponding to 14 cells (7×2). A size of the unit cell 21 may be preset corresponding to a size of a real image device. The size of the cell 21 may vary depending on a pitch of the image device. In addition, the size of the unit cell 21 may be changed on the basis of an input of the user. The grid 20 includes the plurality of cells 21 each having a predetermined size, and the user may adjust the number of the cells 21 to be selected, thereby variously adjusting the size of the virtual image of the image device.

As described above, the controller 600 may control the display 310 to further display text including at least one of a model name, a size, a resolution, and a distance from a floor of the image device corresponding to the displayed virtual image 30 of the image device. In FIG. 19, information indicating that the model name is Model 2, the size is 7×2 (43 inches), and the resolution is 3840×1200 is displayed on an upper end of the virtual image 30 of the image device, and information indicating that the distance from the floor is 1 m is displayed on a lower end of the virtual image 30.

Further, when the camera 100 faces another area of the wall surface W, the user may connect and select the cell 21 displayed on another area of the wall surface W. In other words, when the input of the user for selection of the cell 21 is maintained, the controller 600 may connect the cell 21 that has already been selected and is not displayed on the display 310 and the cell 21 that is selected and displayed on the display 310. That is, when the user selects the cell 21 of the grid 20, a facing direction of the camera 100 does not need to be fixed.

Figure 20:
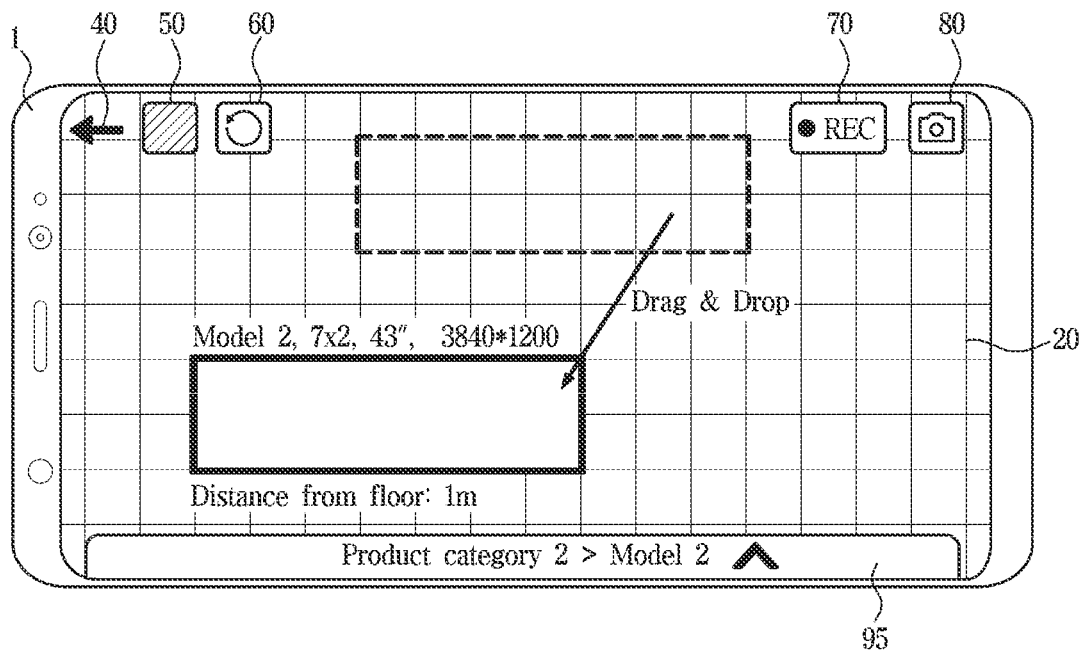

Referring to FIG. 20, the controller 600 may change a location on which the virtual image 30 of the image device is displayed on the basis of an input of the user for changing the location of the virtual image 30 of the image device. That is, according to an input of the user for dragging and dropping, the virtual image 30 of the image device may be changed in location and displayed on the grid 20.

Referring to FIG. 21, the controller 600 may adjust a size of the virtual image 30 of the image device on the basis of a gesture of the user input to the area on which the virtual image 30 of the image device is displayed. For example, when there is an input of the user for simultaneously touching two points of the virtual image 30 of the image device and dragging two points in opposite directions, the virtual image 30 of the image device may be enlarged.

Figure 22:
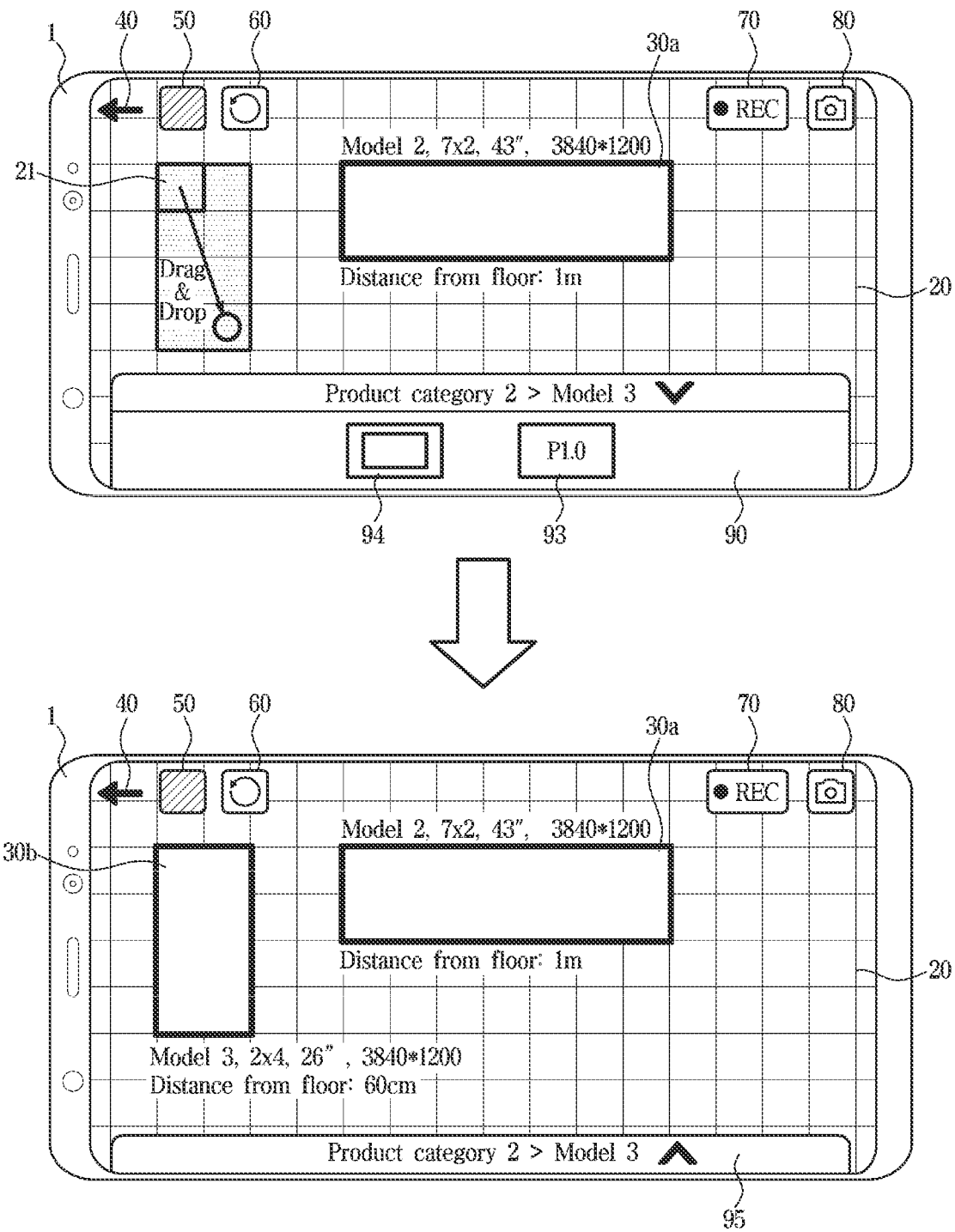

Referring to FIG. 22, on the basis of an input of the user for selecting the additional cell 21 on the grid 20, the controller 600 may control the display 310 to add and display the virtual image 30b of the second image device.

For example, when the user selects the number of cells 21 different from the number of cells 21 that correspond to the virtual image 30a of the first image device, which is already present on the grid 20, the controller 600 may control the display 310 such that the virtual image 30b of the second image device, which is added, is displayed while being distinguished from the virtual image 30a of the first image device.

In FIG. 22, the already displayed virtual image 30a of the first image device includes 14 cells (7×2). In a case in which the number of additional selected cells 21 is eight (2×4), the controller 600 may control the display 310 such that the virtual image 30b of the second image device corresponding to the additional selected cell 21 is displayed while being distinguished from the virtual image 30a of the first image device. In other words, when a horizontal or longitudinal length of the additional selected cells 21 is different from a horizontal or longitudinal length of the virtual image 30a of the first image device, the virtual image 30b of the second image device may be displayed while being distinguished from the virtual image 30a of the first image device.

Further, the controller 600 may control the display 310 to further display text including at least one of a model name, a size, a resolution, and a distance from a floor of the image device corresponding to the virtual image 30b of the second image device. In FIG. 22, information indicating that the model name is Model 2, the size is 7×2 (43 inches), and the resolution is 3840×1200 is displayed on an upper end of the virtual image 30a of the first image device, and information indicating that the distance from the floor is 1 m is displayed on a lower end of the virtual image 30a. In FIG. 22, information indicating that the model name is Model 3, the size is 2×4 (26 inches), and the resolution is 3840×1200 is displayed on a lower end of the virtual image 30b of the second image device, and information indicating that the distance from the floor is 60 cm is also displayed on the lower end of the virtual image 30b. However, the disclosure is not so limited and the information may be displayed similarly as for the virtual image 30a of the first image device, or differently (e.g., some or all of the information may be displayed on a lateral side of the virtual image).

Further, when the user additionally selects the cells 21 to include even an area of the virtual image 30a of the first image device, the controller 600 may control the display 310 to display the virtual image 30b of the second image device on an area other than the area on which the virtual image 30a of the first image device is displayed.

Figure 23:
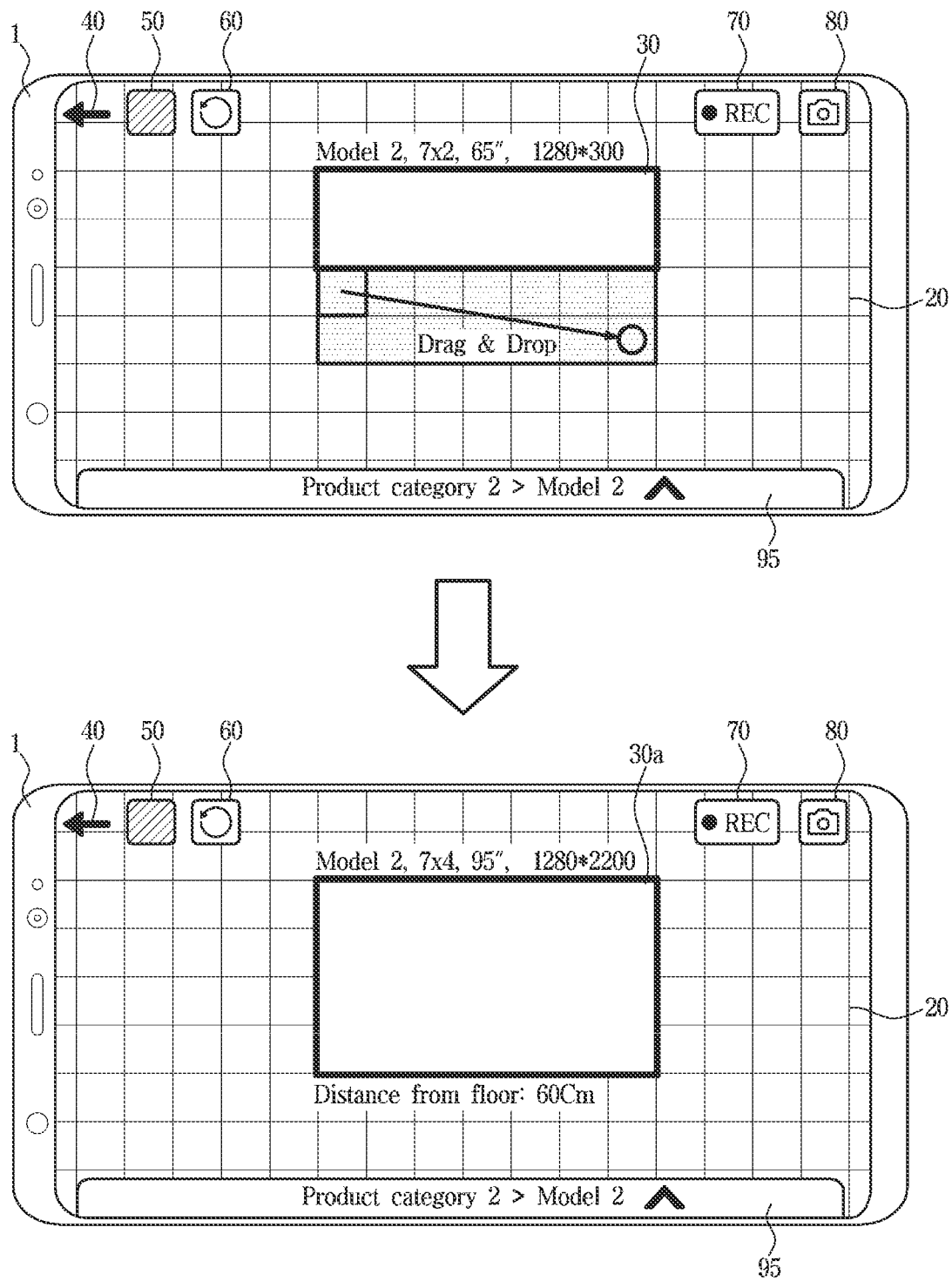

Referring to FIG. 23, the cells 21 corresponding to the size of the virtual image 30 of the image device may be further selected in an area following the virtual image 30 of the image device. In this case, the controller 600 may display the enlarged virtual image 30a of the image device on the display 310 on the basis of the additionally selected cells 21.

FIG. 24 illustrates displaying or hiding the grid.

Referring to FIG. 24, when there is a touch input of the user for the pattern icon 50, the grid 20 displayed on the display 310 may be removed. That is, the controller 600 may control the display 310 to display the image of the space, which is photographed by the camera 100, and the virtual image 30 of the image device, excluding the grid 20. At this point, even when the user moves the mobile device 1 and the direction at which the camera 100 faces is changed, the virtual image 30 of the image device may be viewed as if the virtual image 30 is fixed to the wall surface of the real space. Thus, the user may more easily confirm the form in which the image device may be installed on the wall surface W of the real space.

Figure 25:
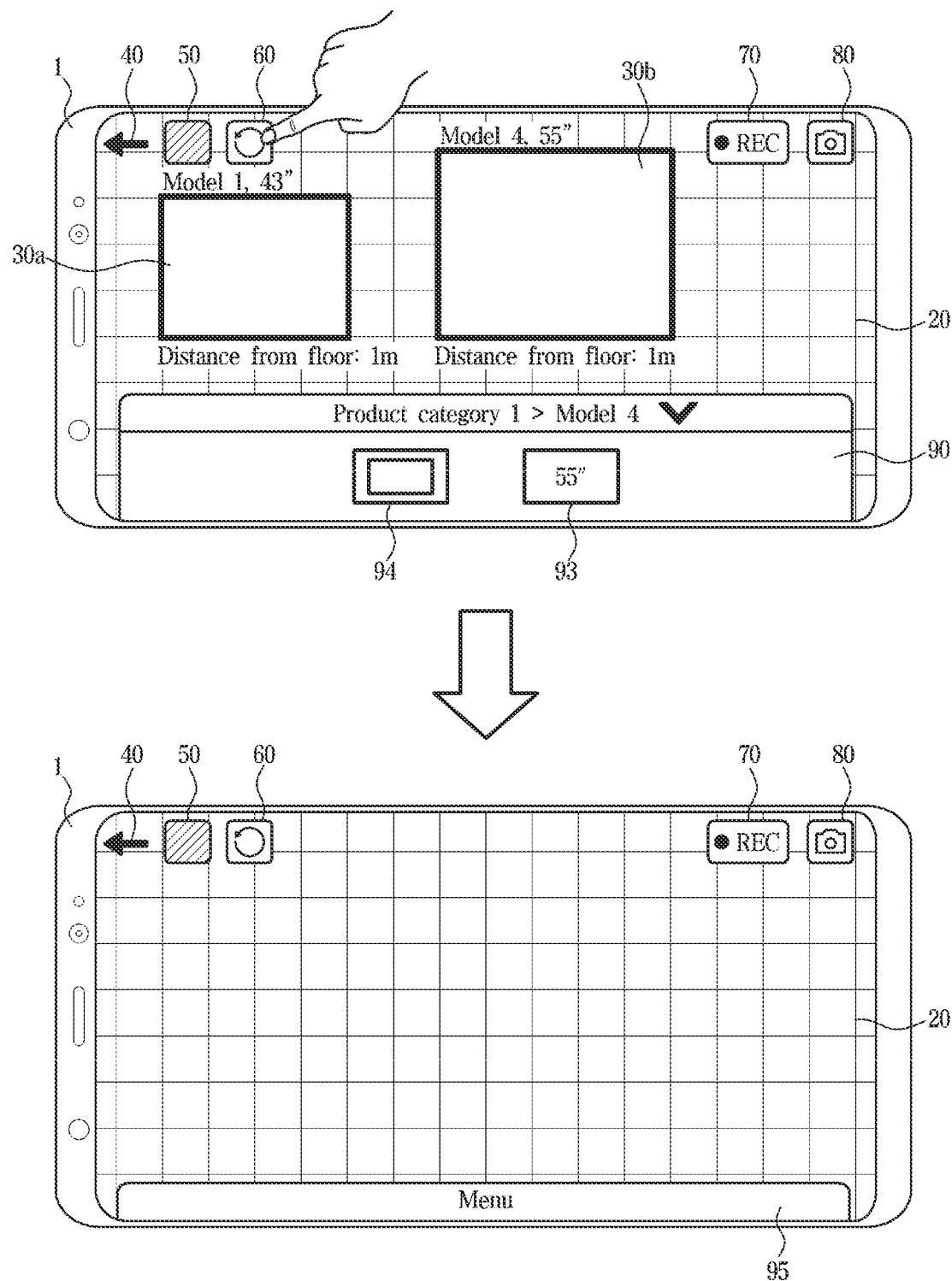
FIGS. 25 and 26 illustrate deleting the virtual image of the image device.
Figure 26:
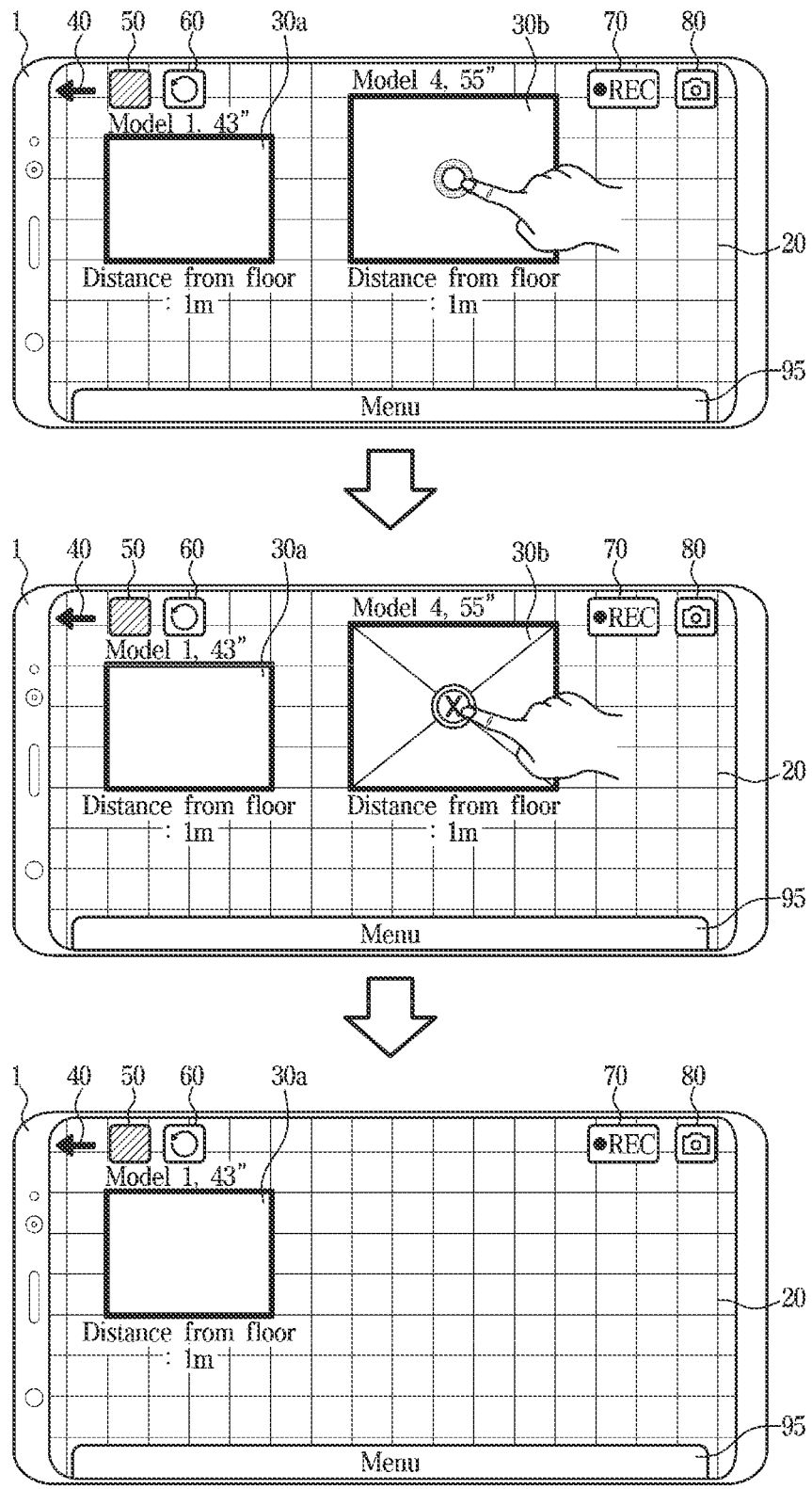

FIGS. 25 and 26 illustrate deleting the virtual image of the image device.

Referring to FIG. 25, the controller 600 may delete the virtual image of the image device on the basis of an input of the user. When the plurality of virtual images of the image device are displayed, the controller 600 may delete all of the virtual images of the plurality of image devices on the basis of the input of the user for deleting the virtual images 30a and 30b of the image devices.

For example, the restart icon 60 may be used to input a command to delete the virtual image 30 of the image device. When a touch of the user is input to the restart icon 60 in the state in which the virtual image 30 of the image device is displayed on the grid 20, the entire virtual image 30 of the image device may be deleted.

In addition, the restart icon 60 may also be used to input a command to perform plane identification again. The controller 600 may identify the plane again on the basis of an input of the user and generate a new grid 20 on a virtual plane corresponding to the plane identified again. For example, when the touch of the user is input to the restart icon 60 in a state in which the virtual image 30 of the image device is not displayed on the grid 20, the controller 600 may identify the plane again and generate the new grid 20 on the virtual plane corresponding to the plane identified again. Identifying the plane again and generating the new grid 20 may be performed by an input of the user for touching the return icon 40.

Referring to FIG. 26, when the plurality of virtual images of the image devices are displayed, the controller 600 may selectively delete the plurality of virtual image of the image devices on the basis of an input of the user for deleting the virtual images 30a and 30b of the image devices. For example, when the virtual image 30a of the first image device and the virtual image 30b of the second image device are displayed, one of the virtual image 30a of the first image device and the virtual image 30b of the second image device may be deleted. For example, the controller 600 may change the virtual image 30b of the second image device into a removable state on the basis of an input of the user for long pressing the virtual image 30b of the second image device. In FIG. 26, as "X" is displayed in a central area of the virtual image 30b of the second image device, the virtual image 30b of the second image device is changed to the removable state. Thereafter, the controller 600 may delete the virtual image 30b of the second image device on the basis of an input of the user for touching "X" displayed in the central area of the virtual image 30b of the second image device. That is, the controller 600 may delete some of the plurality of virtual images of the image devices on the basis of an input of the user.

Meanwhile, as described above, the return icon 40 may be used to input a command to return the screen to the previous screen. The controller 600 may also sequentially delete the plurality of virtual images of the image devices on the basis of an input of the user for touching the return icon 40. For example, the plurality of sequentially displayed virtual images of the image devices may be deleted in a reverse order whenever a return command is input.

As described above, since the user may easily adjust the size and number of the virtual images of the image device, the installation of the image device may be simulated in various ways.

Figure 27:
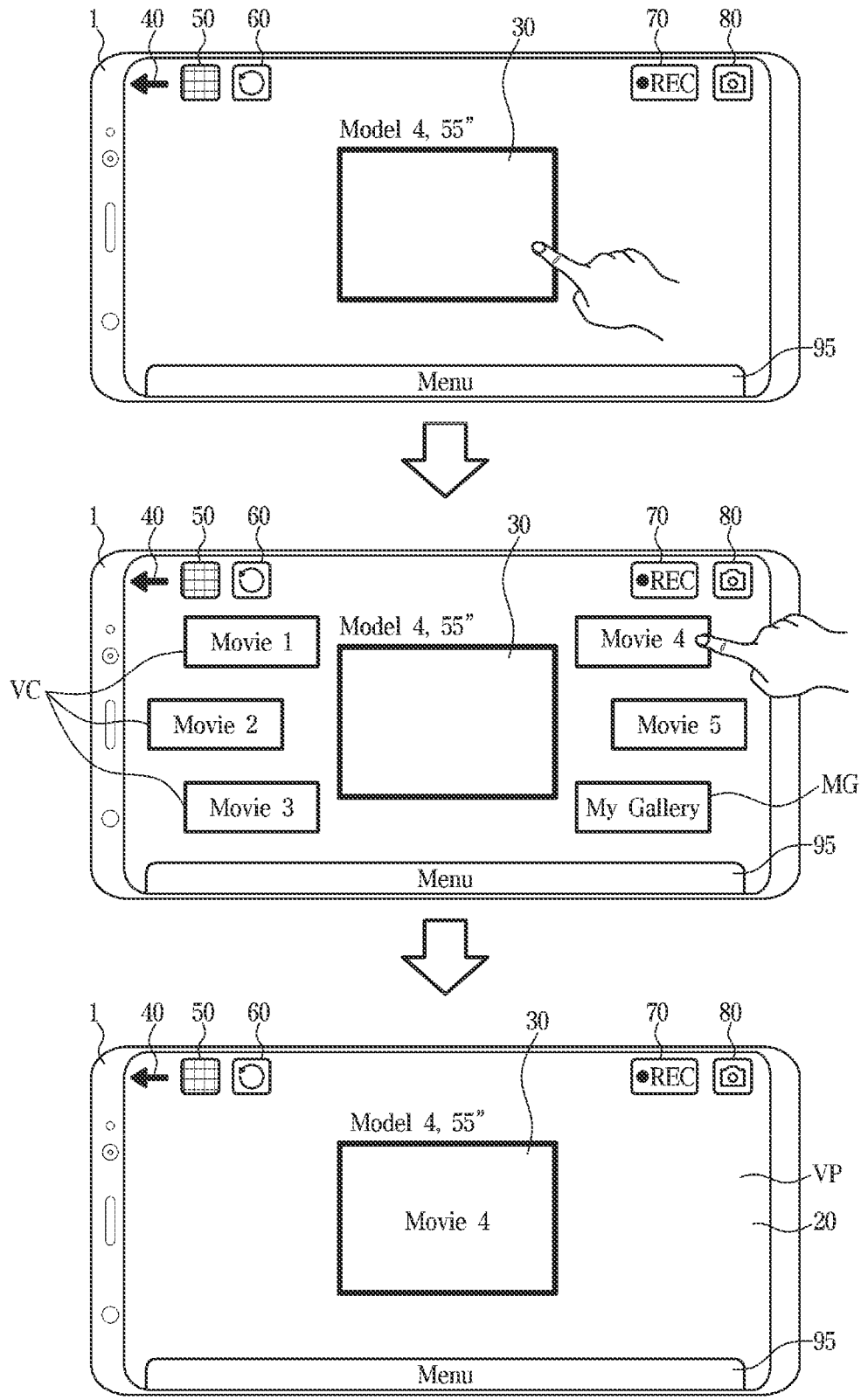
Figure 28:
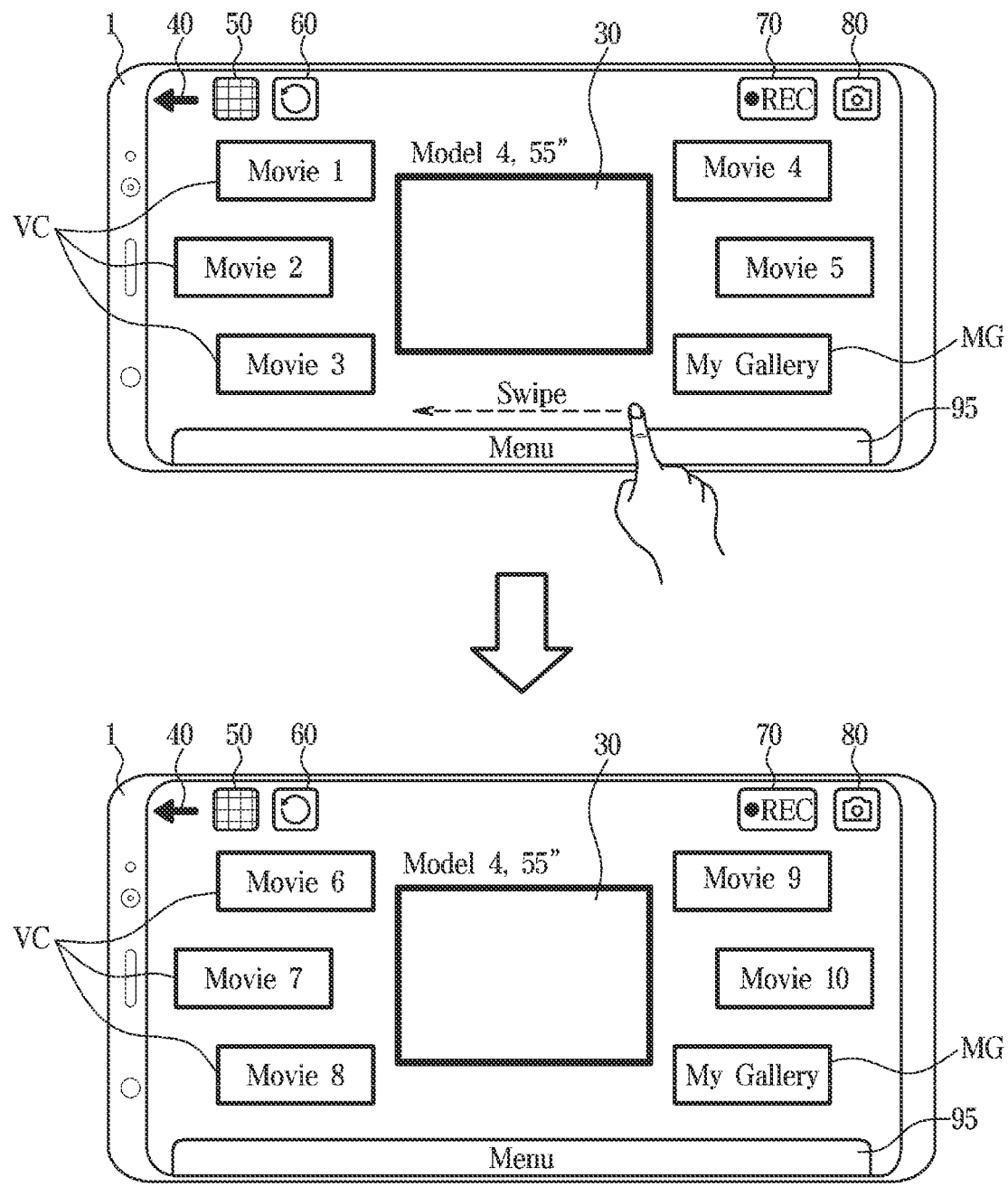

FIGS. 27 to 29 illustrate playing of content on an area on which the virtual image of the image device is displayed.

Referring to FIG. 27, the controller 600 may control the display 310 to display content on an area on which the virtual image 30 of the image device is displayed on the basis of an input of the user for selecting the content. For example, the controller 600 may control the display 310 to display one or more virtual content images VC around the virtual image 30 of the image device in response to the input of the user for selecting the virtual image 30 of the image device. The virtual content image VC is an image that includes content information (e.g., a thumbnail image) that may be played in the virtual image 30 of the image device.

The one or more virtual content images VC may be arranged in various patterns. For example, the one or more virtual content images VC may be circularly arranged to surround the virtual image 30 of the image device or may be arranged in a longitudinal or diagonal direction about the virtual image 30 of the image device.

The controller 600 may control the display 310 to display content corresponding to the selected virtual content image VC on the area on which the virtual image 30 of the image device is displayed on the basis of an input of the user for selecting one of the one or more virtual content images VC. In FIG. 27, when the user selects the virtual content image VC including content information of Movie 4 of the virtual content images VC, Movie 4 may be played on the area on which the virtual image 30 of the image device is displayed. The one or more virtual content images VC may include different pieces of content information, and Movie 4 may be a moving image.

In addition, the one or more virtual content images VC may be displayed for each category. For example, the content category may be classified into a music video category, a movie category, a picture category, and the like. The content may be content obtained from an external server or the like through the communicator 400 or may be content stored in the storage 500 and/or the memory 602. On the basis of an input of the user for selecting a My Gallery icon MG, the controller 600 may control the display 310 to display a list of pieces of content stored in the storage 500 and/or the memory 602.

Referring to FIG. 28, when a swipe gesture of the user is input to an arbitrary area on the display 310 in the state in which the one or more virtual content images VC are displayed around the virtual image 30 of the image device, the controller 600 may display another virtual content image VC around the virtual image 30 of the image device on the display 310. For example, when the swipe gesture of the user is input in a state in which the virtual content images VC representing Movie 1, Movie 2, Movie 3, Movie 4, and Movie 5 are displayed, the virtual content images VC representing Movie 6, Movie 7, Movie 8, Movie 9, and Movie 10 may be displayed around the virtual image 30 of the image device.

Referring to FIG. 29, while the content (e.g., Movie 4) is displayed on the area on which the virtual image 30 of the image device is displayed, a command to rotate the virtual image 30 of the image device may be input. In this case, the controller 600 may control the display 310 to display another piece of content (e.g., Movie 6) suitable for a screen ratio of the rotated virtual image 30 of the image device.

As described above, since various piece of content may be played on the area on which the virtual image of the image device is displayed, the user may perform more realistic simulation.

Further, as described above, according to a mobile device described herein and a method of controlling the mobile device described herein, a user may realistically simulate the installation of an image device by displaying a virtual image corresponding to the image device of an actual size together with an image of a real space in which the image device is to be installed.

Further, according to various examples of the disclosure, a mobile device and a method of controlling the mobile device may perform a more realistic simulation by playing content on an area on which a virtual image corresponding to an image device of an actual size is displayed.

Meanwhile, the disclosed embodiments may be implemented in the form of a recording medium storing instructions executable by a computer. The instructions may be stored in the form of program code and, when executed by a processor, may generate a program module to perform the operation of the disclosed embodiments. The recording medium may be implemented as a computer-readable recording medium, for example, as a non-transitory computer-readable recording medium.

The computer-readable recording medium includes all kinds of recording media storing instructions which are decipherable by a computer. For example, the computer-readable recording medium may include a ROM, a RAM, a magnetic tape, a magnetic disk, a flash memory, an optical data storage device, and the like.

Heretofore, example embodiments have been described with reference to the accompanying drawings. It should be appreciated by those skilled in the art to which the example embodiments pertain that other forms different from the example embodiments may be implemented without departing from the technical spirit and features of the example embodiments. Thus, the example embodiments are merely examples and should not be construed as being limiting. That is, various modifications can be made without departing from the scope of the disclosure.

What is claimed is:

1. A mobile device, comprising:
a display;
a camera configured to capture an image of a space in which a device is to be installed;
a user interface; and
a controller configured to:
identify a plane from the image captured by the camera,
control the display to display a grid on a virtual plane corresponding to the plane,
adjust the grid, based on a user input received via the user interface, control the display to display a virtual image of the device on the grid, and match a starting line of the grid displayed by the display to a boundary of the identified plane.

2. The mobile device of claim 1, wherein the controller is configured to adjust the grid by moving a location of the grid, based on the user input.

3. The mobile device of claim 1, wherein the controller is configured to:

control the display to display the image of the space captured by the camera together with a guide line, and identify the plane based on the guide line.

4. The mobile device of claim 3, wherein the controller is configured to control the display to display the guide line as a base guide line or a corner guide line.

5. The mobile device of claim 1, wherein the controller is configured to control the display to display the virtual image of the device in a specified area of the grid based on an input of the user received via the user interface to select the specified area of the grid.

6. The mobile device of claim 1, wherein the controller is configured to control the display to rotate the virtual image of the device on the virtual plane based on an input of the user received via the user interface to rotate the virtual image of the device.

7. The mobile device of claim 1, wherein the controller is configured to control the display to further display text including at least one of a model name, a size, a resolution, and a distance from a floor of the device corresponding to the virtual image of the device.

8. The mobile device of claim 1, wherein the controller is configured to:

display a menu bar, which enables a selection of at least one of a category, a model, and a size of the device, and control the display to display the virtual image of the device based on an input of the user received via the user interface to select the device from the menu bar.

9. The mobile device of claim 1, wherein, when a plurality of virtual images corresponding to a plurality of devices are displayed, the controller is configured to entirely or partially delete one or more of the plurality of virtual images corresponding to the plurality of devices based on an input of the user received via the user interface to delete the one or more of the plurality of virtual images corresponding to the plurality of devices.

10. The mobile device of claim 1, wherein the controller is configured to:

control the display to display at least one virtual content around the virtual image of the device, and based on an input of the user received via the user interface to select a virtual content from among the at least one virtual content, control the display to display the selected virtual content within an area on which the virtual image of the device is displayed.

11. The mobile device of claim 1, wherein the controller is configured to store a simulation result related to an installation of the device as at least one of a video and a screenshot image.

12. A method of controlling a mobile device, the method comprising:

capturing an image of a space, in which a device is to be installed, by a camera;

identifying a plane from the image captured by the camera;

displaying a grid on a virtual plane corresponding to the plane, by a display;

adjusting the grid based on a user input received via a user interface;

displaying a virtual image of the device on the grid; and matching a starting line of the grid displayed by the display to a boundary of the identified plane.

13. The method of claim 12, wherein the adjusting the grid includes moving a location of the grid based on the user input.

14. The method of claim 12, further comprising displaying, by the display, the image of the space captured by the camera together with a guide line, wherein the identifying the plane includes identifying the plane based on the guide line.

15. The method of claim 14, wherein the displaying, by the display, the image of the space captured by the camera together with the guide line includes displaying the guide line as a base guide line or a corner guide line.

16. The method of claim 12, wherein the displaying the virtual image of the device includes displaying the virtual image of the device in a specified area of the grid based on an input of the user received via the user interface to select the specified area of the grid.

17. The method of claim 12, further comprising:

receiving an input of the user via the user interface to rotate the virtual image of the device;

rotating the virtual image of the device on the virtual plane based on the input of the user received via the user interface to rotate the virtual image of the device; and displaying the rotated virtual image of the device on the grid.

18. The method of claim 12, further comprising displaying text including at least one of a model name, a size, a resolution, and a distance from a floor of the device corresponding to the virtual image of the device.

19. The method of claim 12, further comprising displaying a menu bar which enables a selection of at least one of a category, a model, and a size of the device, wherein the displaying the virtual image of the device includes displaying the virtual image of the device based on an input of the user received via the user interface to select the device from the menu bar.

20. The method of claim 12, further comprising, when a plurality of virtual images corresponding to a plurality of devices are displayed, entirely or partially deleting one or more of the plurality of virtual images corresponding to the plurality of devices based on an input of the user received via the user interface to delete the one or more of the plurality of virtual images corresponding to the plurality of devices.

21. The method of claim 12, further comprising, displaying at least one virtual content around the virtual image of the device; and based on an input of the user received via the user interface to select a virtual content from among the at least one virtual content, displaying the selected virtual content within an area on which the virtual image of the device is displayed.

22. The method of claim 12, further comprising storing a simulation result related to an installation of the device as at least one of a video and a screenshot image.

* * * * *